United States Patent
Jeong et al.

(10) Patent No.: US 11,653,493 B2
(45) Date of Patent: May 16, 2023

(54) SEMICONDUCTOR MEMORY DEVICE AND METHOD OF MANUFACTURING THE SAME

(71) Applicant: Samsung Electronics Co., Ltd., Suwon-si (KR)

(72) Inventors: Sanghoon Jeong, Suwon-si (KR); Sangjun Hong, Hwaseong-si (KR); Sunil Shim, Seoul (KR); Kyunghyun Kim, Seoul (KR); Changsup Mun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 242 days.

(21) Appl. No.: 16/874,159

(22) Filed: May 14, 2020

(65) Prior Publication Data
US 2021/0091104 A1 Mar. 25, 2021

(30) Foreign Application Priority Data
Sep. 20, 2019 (KR) .......................... 10-2019-0116373

(51) Int. Cl.
| | |
|---|---|
| H01L 27/11568 | (2017.01) |
| H01L 27/11556 | (2017.01) |
| G11C 5/02 | (2006.01) |
| H01L 27/11582 | (2017.01) |

(52) U.S. Cl.
CPC ........ *H01L 27/11556* (2013.01); *G11C 5/025* (2013.01); *H01L 27/11582* (2013.01)

(58) Field of Classification Search
None
See application file for complete search history.

(56) References Cited

U.S. PATENT DOCUMENTS

| | | |
|---|---|---|
| 8,796,757 B2 | 8/2014 | Kai et al. |
| 9,865,616 B2 | 1/2018 | Shimizu et al. |
| 9,911,750 B2 | 3/2018 | Lee |
| 10,134,750 B2 | 11/2018 | Kato et al. |
| 10,262,936 B2 | 4/2019 | Yazawa |
| 10,290,651 B2 | 5/2019 | Lee et al. |
| 10,700,090 B1 * | 6/2020 | Cui ..................... H01L 27/1157 |

(Continued)

*Primary Examiner* — Sarah K Salerno
(74) *Attorney, Agent, or Firm* — Myers Bigel, P.A.

(57) ABSTRACT

A semiconductor memory device includes a stack structure comprising horizontal electrodes sequentially stacked on a substrate including a cell array region and an extension region and horizontal insulating layers between the horizontal electrodes. The semiconductor memory device may further include vertical structures that penetrate the stack structure, a first one of the vertical structures being on the cell array region and a second one of the vertical structures being on the extension region. Each of the vertical structures includes a channel layer, and a tunneling insulating layer, a charge storage layer and a blocking insulating layer which are sequentially stacked on a sidewall of the channel layer. The charge storage layer of the first vertical structure includes charge storage patterns spaced apart from each other in a direction perpendicular to a top surface of the substrate with the horizontal insulating layers interposed therebetween. The charge storage layer of the second vertical structure extends along sidewalls of the horizontal electrodes and sidewalls of the horizontal insulating layers.

18 Claims, 33 Drawing Sheets

(56) References Cited

U.S. PATENT DOCUMENTS

| | | |
|---|---|---|
| 2014/0106569 A1* | 4/2014 | Oh .................... H01L 27/11529 |
| | | 438/703 |
| 2018/0053779 A1* | 2/2018 | Park .................. H01L 21/76877 |
| 2018/0053781 A1 | 2/2018 | Yoshimizu et al. |
| 2019/0080764 A1 | 3/2019 | Sugisaki et al. |
| 2019/0081059 A1 | 3/2019 | Xu et al. |
| 2020/0388627 A1* | 12/2020 | Hopkins ................ G11C 5/063 |

* cited by examiner

SEMICONDUCTOR MEMORY DEVICE AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2019-0116373, filed on Sep. 20, 2019, in the Korean Intellectual Property Office, the disclosure of which is hereby incorporated by reference in its entirety.

BACKGROUND

Embodiments of the inventive concept relate to semiconductor memory devices and, more particularly, to three-dimensional (3D) non-volatile memory devices and methods of manufacturing the same.

Semiconductor devices have been highly integrated to provide improved performance and generally low manufacturing costs. The integration density of semiconductor devices may directly affect the costs of semiconductor devices, thereby resulting in highly integrated semiconductor devices being generally high in demand. The integration density of typical two-dimensional (2D) or planar semiconductor devices may be determined by an area of a memory cell unit. Therefore, the integration density of typical 2D or planar semiconductor devices may be affected by a technique used in forming fine patterns. However, because the apparatus used to form fine patterns may be costly, the integration density of 2D semiconductor devices continues to increase but may be limited. Three-dimensional (3D) semiconductor memory devices including three-dimensionally arranged memory cells have been developed to overcome the above limitations.

SUMMARY

Embodiments of the inventive concepts may provide a semiconductor memory device with improved reliability and a method of manufacturing the same.

In some embodiments, a semiconductor memory device may include a stack structure comprising horizontal electrodes sequentially stacked on a substrate including a cell array region and an extension region and horizontal insulating layers between the horizontal electrodes. The semiconductor memory device may further include vertical structures that penetrate the stack structure, a first one of the vertical structures being on the cell array region and a second one of the vertical structures being on the extension region. Each of the vertical structures may include a channel layer, and a tunneling insulating layer, a charge storage layer and a blocking insulating layer, which are sequentially stacked on a sidewall of the channel layer. The charge storage layer of the first one of the vertical structures may include charge storage patterns spaced apart from each other in a direction perpendicular to a top surface of the substrate with the horizontal insulating layers interposed therebetween. The charge storage layer of the second one of the vertical structures may extend along sidewalls of the horizontal electrodes and sidewalls of the horizontal insulating layers.

In some embodiments, a semiconductor memory device may include a stack structure comprising horizontal electrodes sequentially stacked on a substrate including a cell array region and an extension region and horizontal insulating layers between the horizontal electrodes. The semiconductor memory device may further include vertical structures that penetrate the stack structure. Each of the vertical structures may include a channel layer, and a tunneling insulating layer, a charge storage layer and a blocking insulating layer, which are sequentially stacked on a sidewall of the channel layer. Each of the horizontal electrodes may include a cell portion on the cell array region, and an extension portion on the extension region. A top surface of the extension portion may be located at a higher level than a top surface of the cell portion relative to a top surface of the substrate being a base reference, and a bottom surface of the extension portion may be located at a lower level than a bottom surface of the cell portion relative to the top surface of the substrate being the base reference.

In some embodiments, a semiconductor memory device may include stack structures, each of which comprises horizontal electrodes extending in a first direction and sequentially stacked on a substrate including a cell array region and an extension region, and horizontal insulating layers between the horizontal electrodes, the stack structures being spaced apart from each other in a second direction perpendicular to the first direction, separation patterns between the stack structures, vertical structures that penetrate the stack structures, the vertical structures comprising a first vertical structure on the cell array region and a second vertical structure on the extension region, contacts connected to upper portions of the vertical structures, and bit lines on the contacts. Each of the vertical structures may include a filling layer, a channel layer on a sidewall of the filling layer, a tunneling insulating layer, a charge storage layer and a blocking insulating layer which are sequentially stacked on a sidewall of the channel layer, and a pad pattern on a top surface of the channel layer. The charge storage layer of the first vertical structure may include charge storage patterns spaced apart from each other in a direction perpendicular to a top surface of the substrate with the horizontal insulating layers interposed therebetween. The charge storage layer of the second vertical structure may extend along sidewalls of the horizontal electrodes and sidewalls of the horizontal insulating layers.

In some embodiments, a method of manufacturing a semiconductor memory device may include forming a mold structure by stacking first layers and second layers in an alternating sequence on a substrate, which includes a cell array region and an extension region, forming vertical structures that penetrate the mold structure, first ones of the vertical structures being on the cell array region and second ones of the vertical structures being on the extension region, each of the vertical structures comprising a channel layer, and a tunneling insulating layer, a charge storage layer and a blocking insulating layer sequentially stacked on a sidewall of the channel layer. The method further comprising forming a first trench that penetrates the mold structure and extends in a first direction parallel to a top surface of the substrate, removing the first layers of the cell array region through the first trench to form gap regions, etching the charge storage layers of the first ones of the vertical structures through the gap regions to divide each of the charge storage layers into charge storage patterns, forming a separation pattern in the first trench and the gap regions, forming a second trench which extends from the cell array region onto the extension region and penetrates the mold structure, and replacing the second layers with horizontal electrodes through the second trench.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
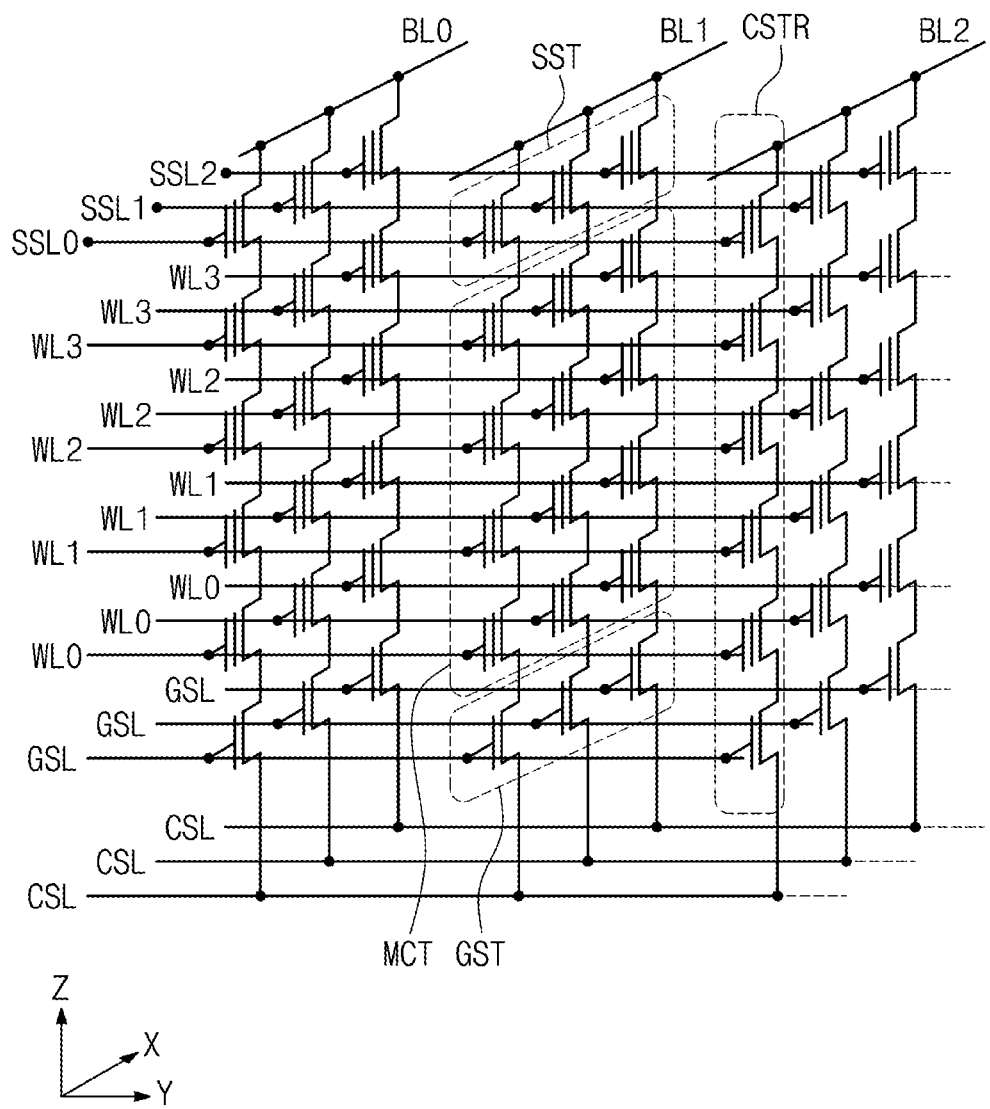
FIG. 1 is a schematic circuit diagram illustrating a cell array of a semiconductor memory device according to some embodiments of the inventive concept.

FIG. 1 is a schematic circuit diagram illustrating a cell array of a semiconductor memory device according to some embodiments of the inventive concept.

Referring to FIG. 1, a semiconductor memory device, according to some embodiments, may include a common source line CSL, a plurality of bit lines BL0 to BL2, and a plurality of cell strings CSTR provided between the common source line CSL and the bit lines BL0 to BL2.

The common source line CSL may be a conductive layer disposed on a semiconductor substrate or a dopant region formed in the semiconductor substrate. The bit lines BL0 to BL2 may be conductive patterns (e.g., metal lines) vertically (i.e., in the Z direction) spaced apart from the semiconductor substrate. The bit lines BL0 to BL2 may be two-dimensionally arranged, and a plurality of the cell strings CSTR may be connected in parallel to each of the bit lines BL0 to BL2. Thus, the cell strings CSTR may be two-dimensionally arranged on the common source line CSL or the semiconductor substrate.

Each of the cell strings CSTR may include a ground selection transistor GST connected to the common source line CSL, a string selection transistor SST connected to one of the bit lines BL0 to BL2, and a plurality of memory cell transistors MCT provided between the ground and string selection transistors GST and SST. The ground selection transistor GST, the memory cell transistors MCT and the string selection transistor SST may be connected in series to each other. A ground selection line GSL, a plurality of word lines WL0 to WL3, and a string selection line SSL0, SSL1 or SSL2, which are disposed between the common source line CSL and the bit lines BL0 to BL2, may be used as gate electrodes of the ground selection transistor GST, the memory cell transistors MCT, and the string selection transistor SST, respectively.

The ground selection transistors GST may be disposed at substantially equal distances from the semiconductor substrate, and the gate electrodes of the ground selection transistors GST may be connected in common to the ground selection line GSL so as to be in an equipotential state. To achieve this, the ground selection line GSL may be a plate-shaped or comb-shaped conductive pattern disposed between the common source line CSL and the memory cell transistor MCT closest to the common source line CSL. Likewise, the gate electrodes of the memory cell transistors MCT disposed at substantially equal distances from the common source line CSL may be connected in common to one of the word lines WL0 to WL3 so as to be in an equipotential state. To achieve this, each of the word lines WL0 to WL3 may be a plate-shaped or comb-shaped conductive pattern configured in parallel to a top surface of the semiconductor substrate. Because a single cell string CSTR includes the plurality of memory cell transistors MCT respectively located at different levels from the common source line CSL, the word lines WL0 to WL3 located at different levels from each other may be disposed between the common source line CSL and the bit lines BL0 to BL2.

Each of the cell strings CSTR may include a channel structure that vertically (i.e., in the Z direction) extends from the common source line CSL so as to be connected to one of the bit lines BL0 to BL2. The channel structure may penetrate the ground selection line GSL, the word lines WL0 to WL3, and the string selection line SSL0, SSL1 or SSL2. In addition, the channel structure may include a body portion and a dopant region formed at one end or both ends of the body portion. For example, a drain region may be formed at a top end of the body portion.

A data storage layer may be disposed between the channel structure and the word lines WL0 to WL3. In some embodiments, the data storage layer may include a charge storage layer.

A dielectric layer used as a gate insulating layer of the ground selection transistor GST and/or the string selection transistor SST may be disposed between the ground selection line GSL and the channel structure and/or between the string selection line SSL0, SSL1 or SSL2 and the channel structure. The gate insulating layer of at least one of the ground and string selection transistors GST and SST may be formed of the same material as the data storage layer of the memory cell transistor MCT or may be a gate insulating layer (e.g., a silicon oxide layer) for a general transistor (MOSFET).

The ground and string selection transistors GST and SST and the memory cell transistors MCT may be metal-oxide-semiconductor (MOS) field effect transistors using the channel structure as channel regions. In some embodiments, the channel structure may form MOS capacitors with the ground selection line GSL, the word lines WL0 to WL3, and the string selection line SSL0, SSL1 or SSL2. In this example, the ground selection transistor GST, the memory cell transistors MCT and the string selection transistor SST may share inversion layers generated by fringe fields generated from the lines GSL, WL0 to WL3 and SSL0 to SSL2, and, thus, the transistors GST, MCT and SST included in each cell string CSTR may be electrically connected to each other.

Figure 2:
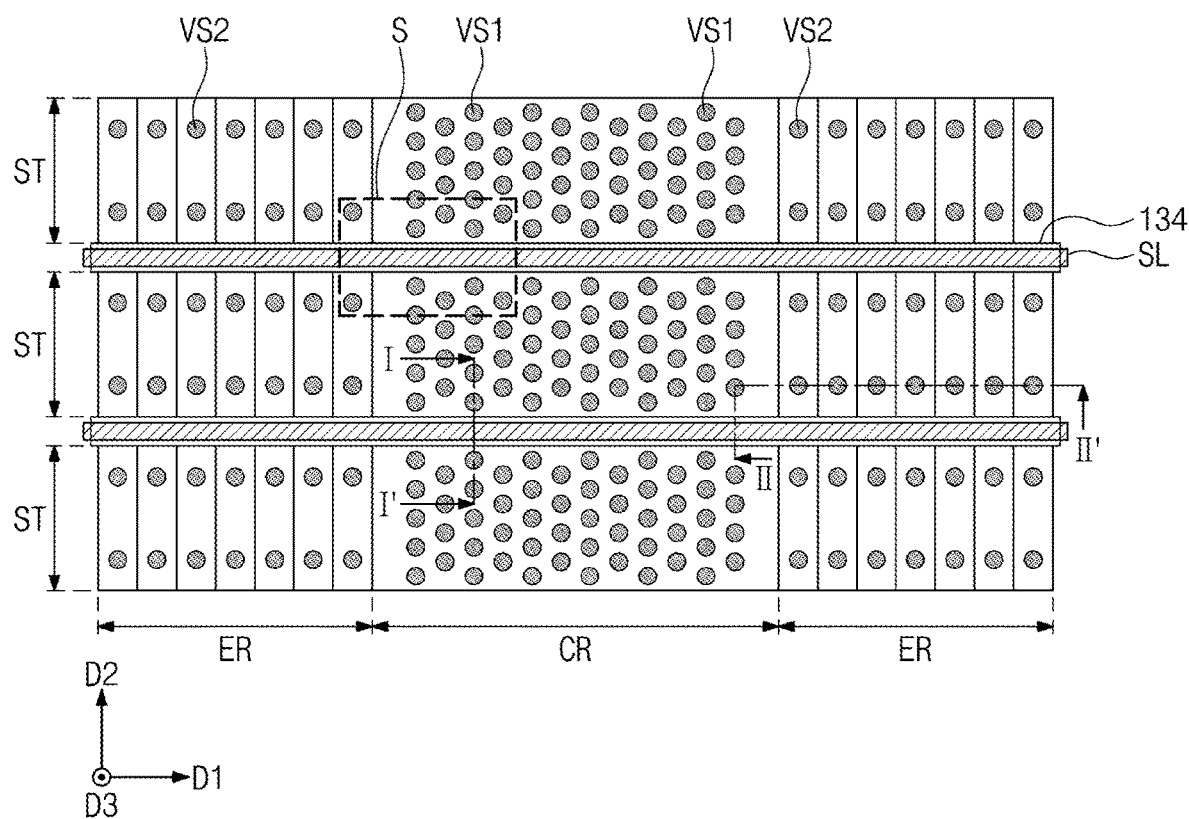
FIG. 2 is a plan view illustrating a semiconductor memory device according to some embodiments of the inventive concept.
Figure 3A:
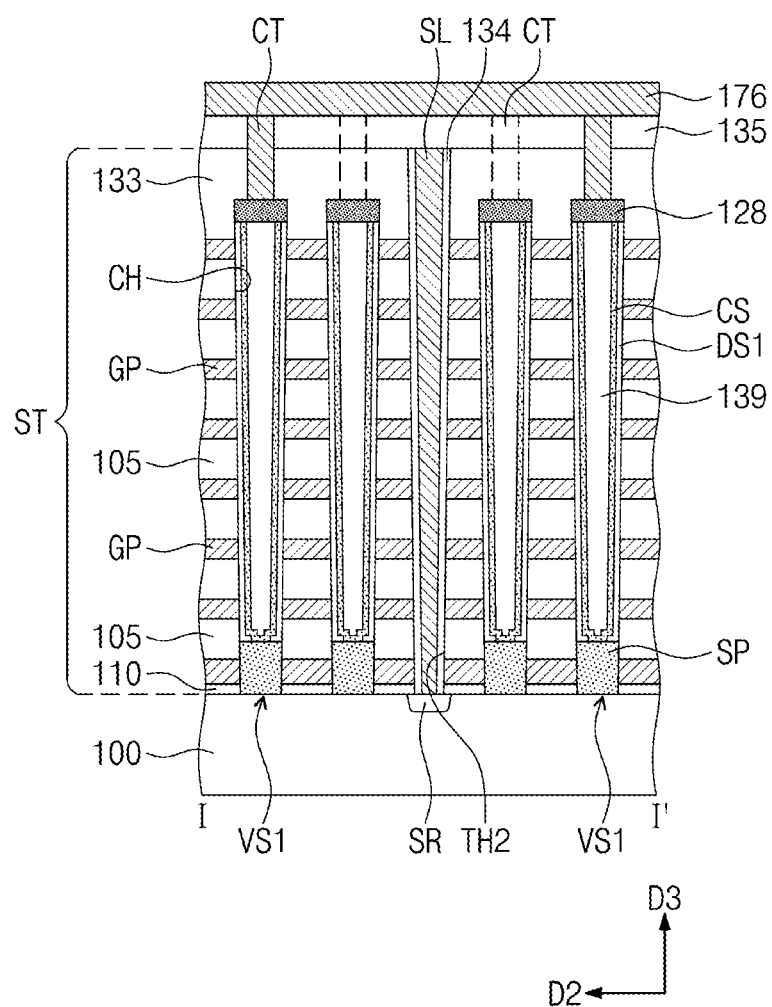
FIGS. 3A and 3B are cross-sectional views taken along lines I-I' and II-II' of FIG. 2, respectively, to illustrate a semiconductor memory device according to some embodiments of the inventive concept.
Figure 3B:
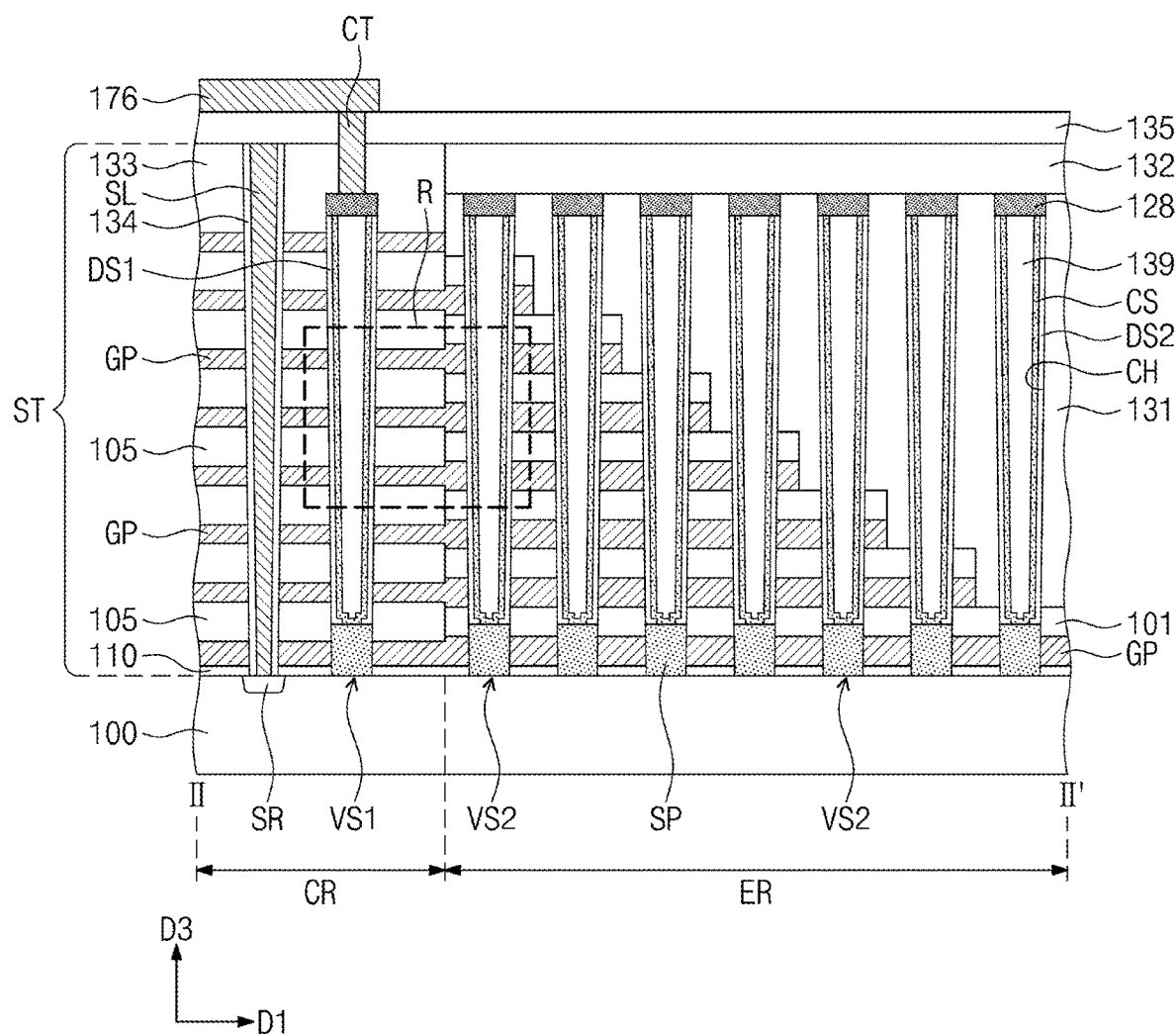
Figure 4:
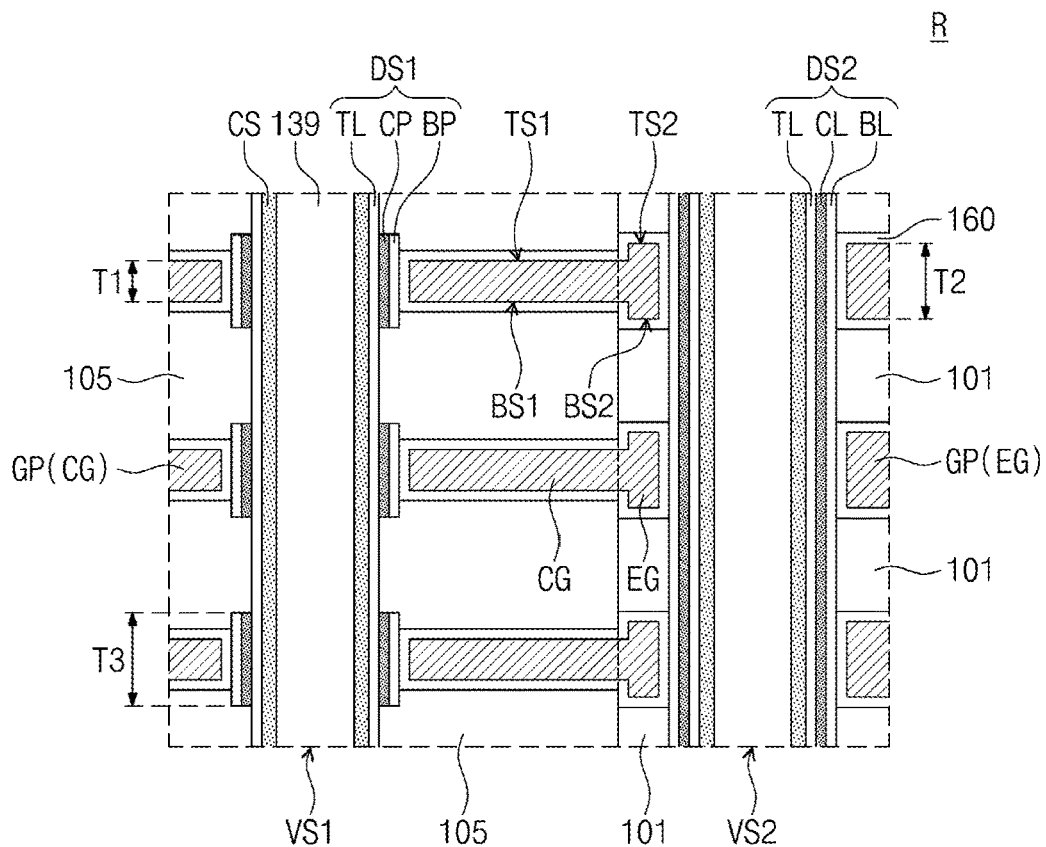
FIG. 4 is an enlarged view of a region 'R' of FIG. 3B.

FIG. 2 is a plan view illustrating a semiconductor memory device according to some embodiments of the inventive concept. FIGS. 3A and 3B are cross-sectional views taken along lines I-I' and II-IF of FIG. 2, respectively, to illustrate a semiconductor memory device according to some embodiments of the inventive concept. FIG. 4 is an enlarged view of a region 'R' of FIG. 3B.

Referring to FIGS. 2, 3A, 3B, and 4, a semiconductor memory device, according to some embodiments of the inventive concept, may include a cell array region CR and an extension region ER provided at an end portion of the cell array region CR. For example, the extension regions ER may be provided at both end portions of the cell array region CR, respectively. Hereinafter, the cell array region CR and the extension region ER will be described based on a substrate 100. A plurality of stack structures ST may be disposed on a substrate 100 including the cell array region CR and the extension region ER. The stack structures ST may extend in a first direction D1 parallel to a top surface of the substrate 100 and may be spaced apart from each other in a second direction D2, which is parallel to the top surface of the substrate 100 and is perpendicular to the first direction D1. The substrate 100 may include a silicon substrate, a silicon-germanium substrate, a germanium substrate, and/or a single-crystalline epitaxial layer grown on a single-crystalline silicon substrate.

A source region SR (see, e.g., FIG. 3B) may be disposed in the substrate 100. The source region SR may be disposed between the stack structures ST in a plan view and may extend in the first direction D1. The source region SR may be a dopant region having a different conductivity type from that of the substrate 100.

Each of the stack structures ST may include horizontal electrodes GP stacked in a third direction D3 perpendicular to the top surface of the substrate 100. A lowermost one of the horizontal electrodes GP may be the ground selection line GSL of FIG. 1, and an uppermost one of the horizontal electrodes GP may be the string selection line SSL of FIG. 1. The horizontal electrodes GP between the lowermost and uppermost horizontal electrodes may be the word lines WL. In other embodiments, a plurality of the horizontal electrodes GP may be used as the string selection lines SSL. For example, the horizontal electrodes GP may include a doped semiconductor material (e.g., doped silicon), a metal (e.g., tungsten, copper, or aluminum), a conductive metal nitride (e.g., titanium nitride or tantalum nitride), and/or a transition metal (e.g., titanium or tantalum).

Second horizontal insulating layers 105 may be disposed between the horizontal electrodes GP on the cell array region CR. First horizontal insulating layers 101 may be disposed between the horizontal electrodes GP on the extension region ER. For example, the first horizontal insulating layers 101 and the horizontal electrodes GP may be alternately and repeatedly stacked on the extension region ER, and the second horizontal insulating layers 105 and the horizontal electrodes GP may be alternately and repeatedly stacked on the cell array region CR. As illustrated in FIG. 4, the second horizontal insulating layers 105 may be connected to the first horizontal insulating layers 101 near a boundary between the cell array region CR and the extension region ER. The first and second horizontal insulating layers 101 and 105 may have different thicknesses in the D3 direction in accordance with characteristics of the semiconductor memory device. The horizontal insulating layers 101 and 105 may include, for example, silicon oxide. A buffer layer 110 may be provided between the lowermost horizontal electrode GP and the substrate 100. The buffer layer 110 may include silicon oxide. A first separation pattern 133 may be provided on the uppermost horizontal electrode GP on the cell array region CR. The first separation pattern 133 may include silicon oxide.

End portions (i.e., pads) of the horizontal electrodes GP may be exposed (i.e., be free of other layers or materials) in a staircase shape on the extension region ER. Each of the pads may be defined as the end portion of each of the horizontal electrodes GP, which is exposed by another horizontal electrode GP disposed directly thereon. Contacts for applying voltages to the horizontal electrodes GP may be connected to the end portions (i.e., the pads) of the horizontal electrodes GP. On the extension region ER, a sidewall of an end portion of each of the first horizontal insulating layers 101 may be aligned with a sidewall of the end portion of the horizontal electrode GP disposed directly thereunder. A first interlayer insulating layer 131 may be provided to cover the pads on the extension region ER. A second interlayer insulating layer 132 may be provided on the first interlayer insulating layer 131 on the extension region ER. A top surface of the second interlayer insulating layer 132 may be located at the same level as a top surface of the first separation pattern 133. The first and second interlayer insulating layers 131 and 132 may include silicon oxide.

As illustrated in FIG. 4, each of the horizontal electrodes GP may include a cell portion CG on the cell array region CR and an extension portion EG on the extension region ER. Some horizontal electrodes GP (e.g., the uppermost horizontal electrodes) may not include the extension portion EG. A top surface TS2 of the extension portion EG may be located at a higher level in the D3 direction than a top surface TS1 of the cell portion CG. A bottom surface BS2 of the extension portion EG may be located at a lower level in the D3 direction than a bottom surface BS1 of the cell portion CG. For example, a thickness T2 of the extension portion EG may be greater than a thickness T1 of the cell portion CG. Due to the level difference and/or the thickness difference, the horizontal electrode GP may have a stepped structure at a boundary of the extension portion EG and the cell portion CG.

Vertical structures VS1 and VS2 may be provided to penetrate the stack structure ST. The vertical structures VS1 and VS2 may be provided in vertical holes CH penetrating the stack structure ST. The vertical structures VS1 and VS2 may include first vertical structures VS1 provided on the cell array region CR and second vertical structures VS2 provided on the extension region ER. The first vertical structures VS1 and the horizontal electrodes GP adjacent thereto may constitute the cell strings CSTR of FIG. 1. The second vertical structures VS2 may not constitute memory cell transistors, but may be dummy structures for supporting a mold structure in a manufacturing process. For example, the second vertical structures VS2 may not be connected to an upper interconnection line through contacts. The first vertical structures VS1 may be arranged in a zigzag form in the second direction D2 when viewed in a plan view.

Each of the vertical structures VS1 and VS2 may include a filling layer 139, a channel layer CS, a data storage layer DS1 or DS2, and a pad pattern 128. The channel layer CS and the data storage layer DS1 or DS2 may be sequentially stacked on a sidewall of the filling layer 139. For example, the channel layer CS may be disposed between the filling layer 139 and the data storage layer DS1 or DS2. The pad pattern 128 may be disposed in an upper portion of each of the vertical structures VS1 and VS2 and may be on and at least partially cover a top surface of the data storage layer DS1 or DS2.

The channel layer CS may include a poly-crystalline silicon layer, an organic semiconductor layer, or a carbon nanostructure. Each of the data storage layers DS1 and DS2 may include a tunneling insulating layer TL, a charge storage layer CL, and a blocking insulating layer BL. The tunneling insulating layer TL may border a sidewall of the channel layer CS and may extend along the sidewall of the channel layer CS in the third direction D3. The tunneling insulating layer TL may include, for example, a silicon oxide layer.

For example, the charge storage layer CL may include a silicon nitride layer. For example, the blocking insulating layer BL may include a silicon oxide layer.

A first data storage layer DS1 of the first vertical structure VS1 and a second data storage layer DS2 of the second vertical structure VS2 may have different structures from each other. For example, structures of the charge storage layer and the blocking insulating layer of the first data storage layer DS1 may be different from those of the charge storage layer CL and the blocking insulating layer BL of the second data storage layer DS2. The charge storage layer CL of the second data storage layer DS2 may continuously extend in the third direction D3 along sidewalls of the horizontal electrodes GP and sidewalls of the first horizontal insulating layers 101. In other words, the charge storage layer CL of the second data storage layer DS2 may be provided in regions between the channel layer CS and the first horizontal insulating layers 101 and regions between the channel layer CS and the horizontal electrodes GP. In contrast, the charge storage layer of the first data storage layer DS1 may include charge storage patterns CP that are spaced apart from each other in the third direction D3 with the second horizontal insulating layers 105 interposed therebetween. In other words, the charge storage patterns CP of the first data storage layer DS1 may be intermittently disposed along the third direction D3. Each of the charge storage patterns CP may have a ring shape when viewed in a plan view.

The charge storage patterns CP may be disposed in regions between the channel layer CS and the horizontal electrodes GP, but may not be disposed in regions between the channel layer CS and the second horizontal insulating layers 105. Thus, charges included in each of the charge storage patterns CP may not move or spread into other charge storage patterns CP. Data retention characteristics of the semiconductor memory device may be improved due to the structure in which the charge storage patterns CP are vertically separated from each other.

Like the charge storage layer, the structure of the blocking insulating layer of the first data storage layer DS1 may be different from that of the blocking insulating layer BL of the second data storage layer DS2. The blocking insulating layer BL of the second data storage layer DS2 may continuously extend in the third direction D3 along the sidewalls of the horizontal electrodes GP and the sidewalls of the first horizontal insulating layers 101. In contrast, the blocking insulating layer of the first data storage layer DS1 may include blocking insulating patterns BP that are spaced apart from each other in the third direction D3 with the second horizontal insulating layers 105 interposed therebetween. Each of the blocking insulating patterns BP may have a ring shape when viewed in a plan view.

A width T3, in the third direction D3, of each of the blocking insulating patterns BP may be greater than the thickness T1 of an adjacent portion (i.e., the cell portion CG) of the horizontal electrode GP. A width T3, in the third direction D3, of each of the charge storage patterns CP may be greater than the thickness T1 of an adjacent portion (i.e., the cell portion CG) of the horizontal electrode GP.

Figure 13A:
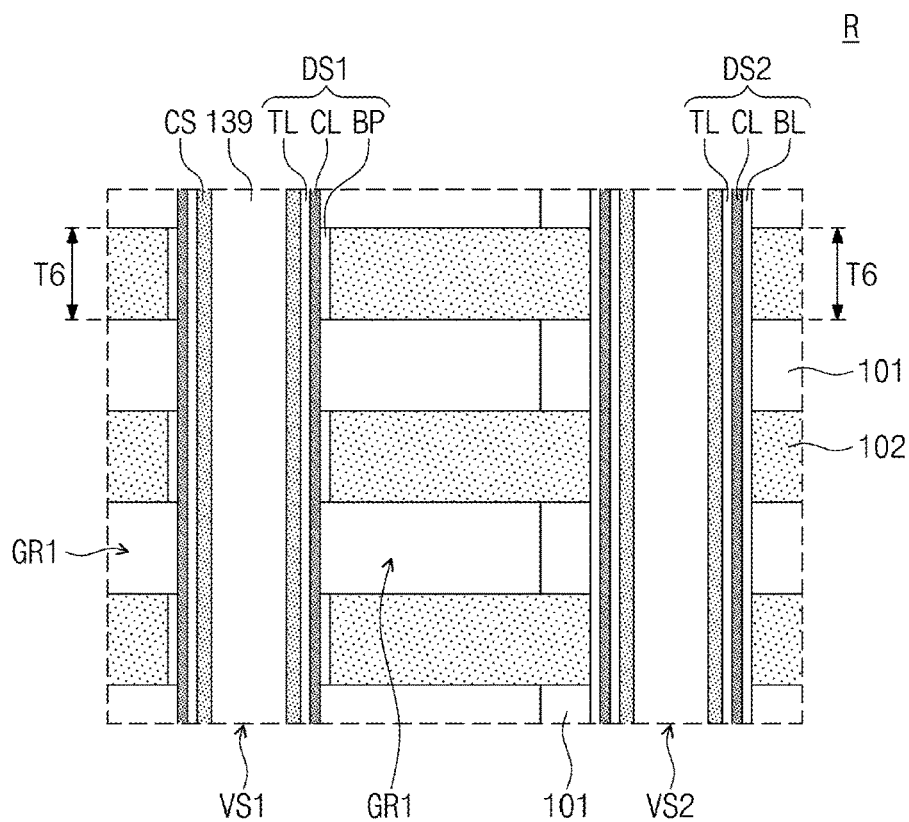
Figure 13B:
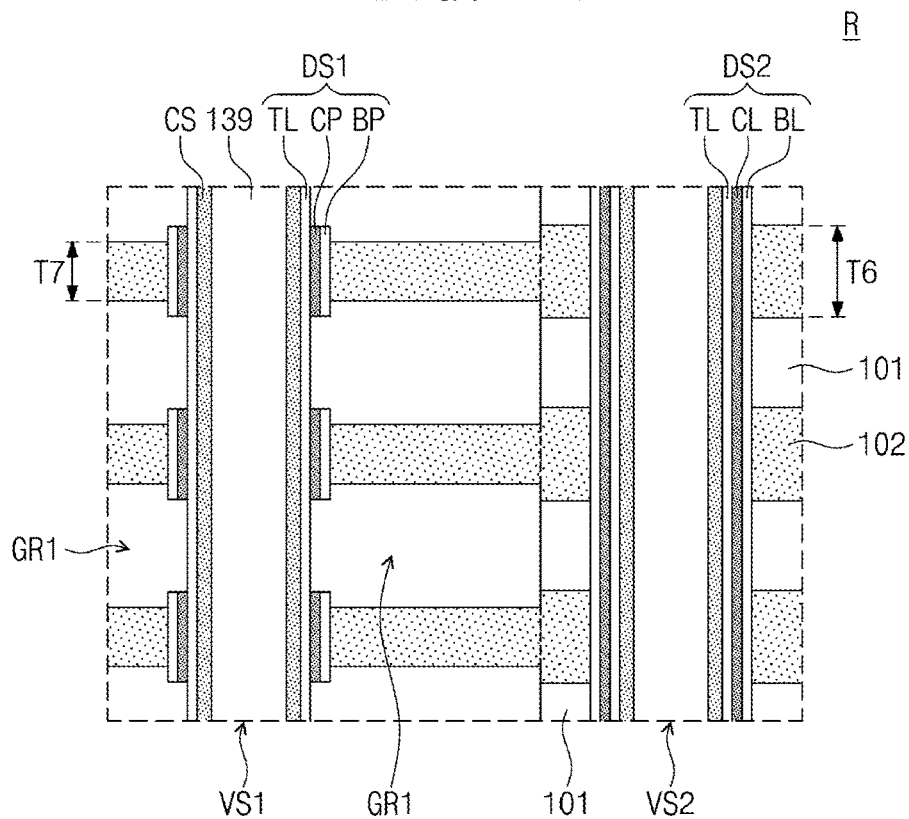
Figure 13C:
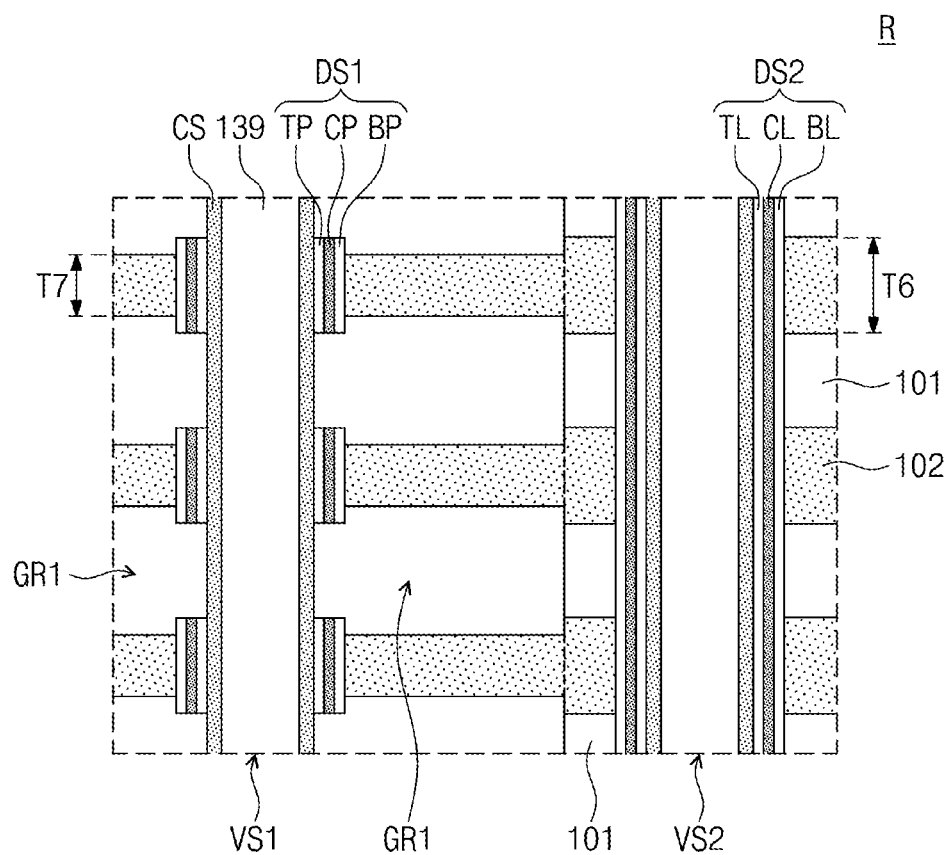

Unlike the charge storage layer and the blocking insulating layer, the tunneling insulating layer TL of the first data storage layer DS1 may have substantially the same shape as the tunneling insulating layer TL of the second data storage layer DS2. In other embodiments, like the charge storage layer and the blocking insulating layer, the structure of the tunneling insulating layer TL of the first data storage layer DS1 may be different from that of the tunneling insulating layer TL of the second data storage layer DS2. For example, as illustrated in FIG. 13C, the tunneling insulating layer of the first data storage layer DS1 may include tunneling insulating patterns TP spaced apart from each other in the third direction D3. Hereinafter, example embodiments of the inventive concept will be described with reference to FIG. 4.

Semiconductor pillars SP may be disposed between the substrate 100 and the vertical structures VS1 and VS2. The semiconductor pillars SP may be formed by performing a selective epitaxial growth (SEG) process using the substrate 100 as a seed. For example, the semiconductor pillars SP may include an intrinsic semiconductor material or a P-type semiconductor material.

A barrier insulating layer 160 may be disposed between the horizontal electrodes GP and the horizontal insulating layers 105 and 101 and may extend between the blocking insulating layer BL and the horizontal electrodes GP. The barrier insulating layer 160 may be in physical contact with the blocking insulating layer BL. The barrier insulating layer 160 may include a single layer or a plurality of layers. For example, the barrier insulating layer 160 may include a metal oxide layer and/or a metal nitride layer. For example, the barrier insulating layer 160 may be a portion of a blocking insulating layer of a charge trap-type non-volatile memory transistor.

The pad pattern 128 may be in physical contact with the channel layer CS and may be electrically connected to the channel layer CS. The pad pattern 128 may include polycrystalline silicon doped with dopants of which a conductivity type is different from that of dopants (e.g., P-type dopants) of the substrate 100. For example, the pad pattern 128 may include N-type dopants.

A source line SL may be disposed between the stack structures ST and may be connected to the source region SR. The source line SL may have a line shape or rectangular shape extending along the source region SR in the first direction D1 when viewed in a plan view (see, e.g., FIG. 2). In other embodiments, the source line SL may include contacts separated from each other in the first direction D1. For example, the source line SL may be formed of a metal (e.g., tungsten, copper, or aluminum) and/or a transition metal (e.g., titanium or tantalum). A second separation pattern 134 may be disposed between the source line SL and the stack structures ST. The second separation pattern 134 may extend in the first direction D1. For example, the second separation pattern 134 may include an insulating material (e.g., silicon oxide or silicon nitride).

Figure 5:
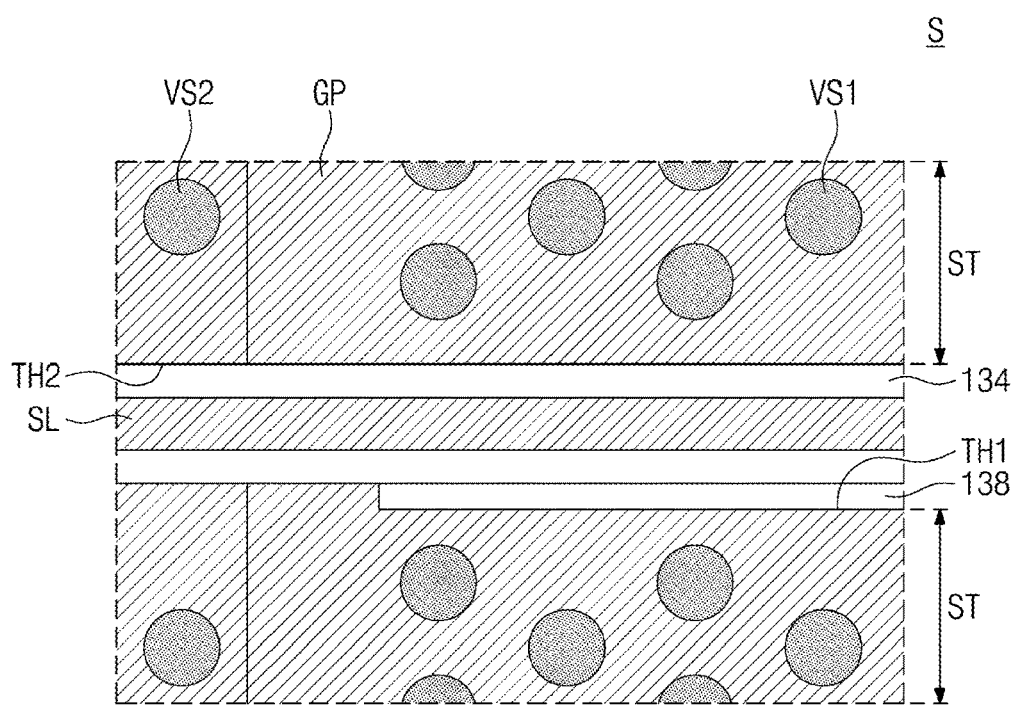
FIG. 5 is an enlarged view of a region 'S' of FIG. 2 to illustrate a level of one of horizontal electrodes.

FIG. 5 is an enlarged view of a region 'S' of FIG. 2 to illustrate a level of one of horizontal electrodes. As illustrated in FIG. 5, a second trench TH2 may be provided between the stack structures ST adjacent to each other, and the source line SL and the second separation pattern 134 may be provided in the second trench TH2. The second separation pattern 134 may be provided on the cell array region CR and the extension region ER. A protrusion separation pattern 138 may protrude from the second separation pattern 134 toward the horizontal electrode GP in the second direction D2 and/or a direction opposite to the second direction D2. The protrusion separation pattern 138 may be provided in a first trench TH1. The protrusion separation pattern 138 may be a portion of a layer formed simultaneously and/or in synchronization with the first separation pattern 133. The first trench TH1 and the second trench TH2 may expose the top surface of the substrate 100. The protrusion separation pattern 138 may be provided locally on the cell array region CR, but may not extend onto the extension region ER. The first and second separation patterns 133 and 134 may include silicon oxide.

A third interlayer insulating layer 135 may be provided to be on and at least partially cover the second interlayer insulating layer 132 and the first separation pattern 133. For example, the third interlayer insulating layer 135 may include at least one of a silicon oxide layer, a silicon nitride layer, and/or a silicon oxynitride layer. Contact plugs CT may penetrate the third interlayer insulating layer 135 and may be in contact with the pad patterns 128. The contact plugs CT may include doped silicon and/or a metallic material (e.g., tungsten (W), copper (Cu), or aluminum (Al)). Bit lines 176 may be disposed on the third interlayer insulating layer 135. The bit lines 176 may be electrically connected to the first vertical structures VS1 through the contact plugs CT. The bit lines 176 may include a conductive material.

Figure 6:
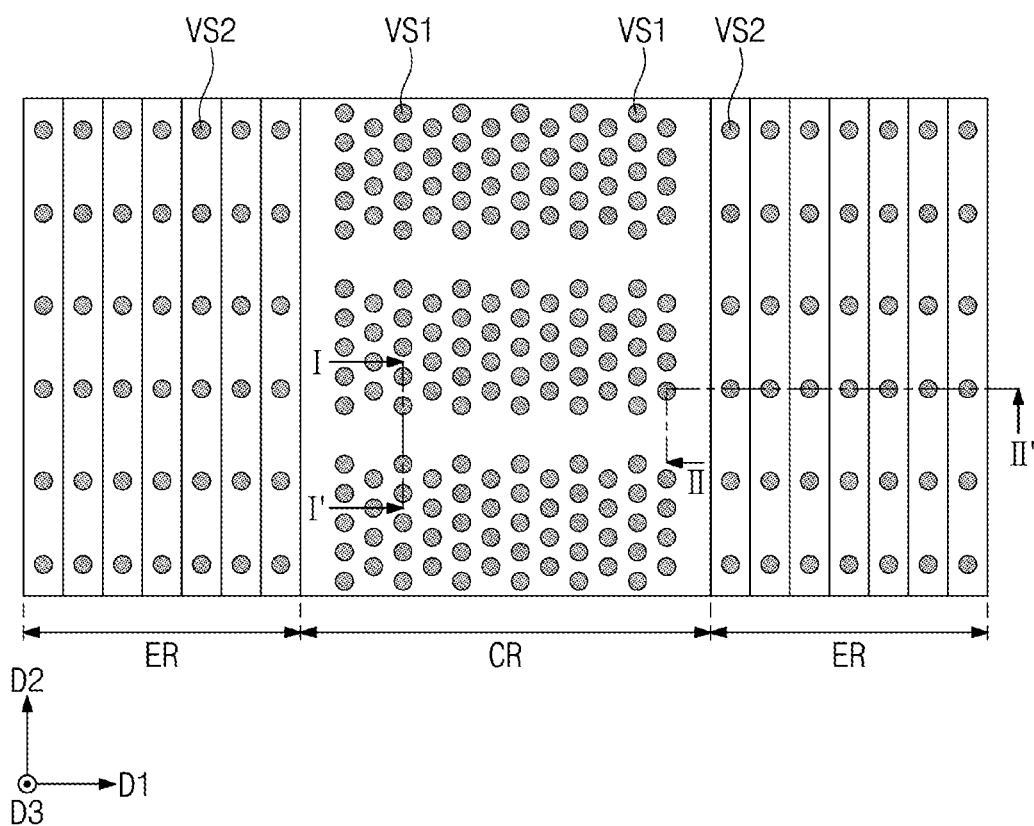
FIGS. 6, 8 and 15 are plan views illustrating a method of manufacturing a semiconductor memory device, according to some embodiments of the inventive concept.
Figure 7A:
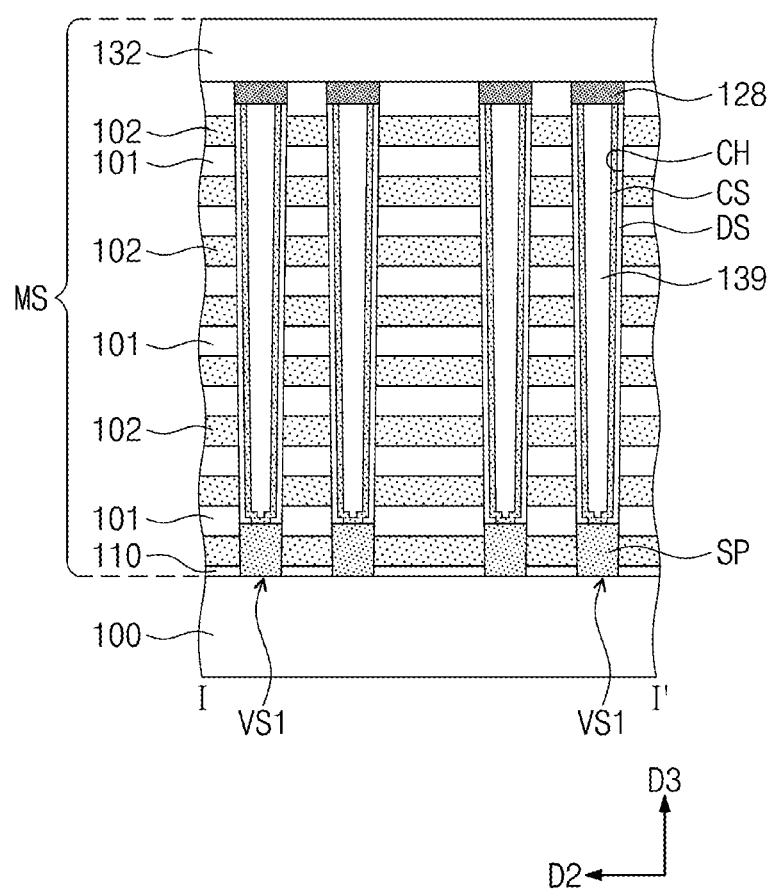
FIGS. 7A, 9A, 10A, 12A, 14A and 16A are cross-sectional views taken along lines I-I' of FIGS. 6, 8 and 15.
Figure 7B:
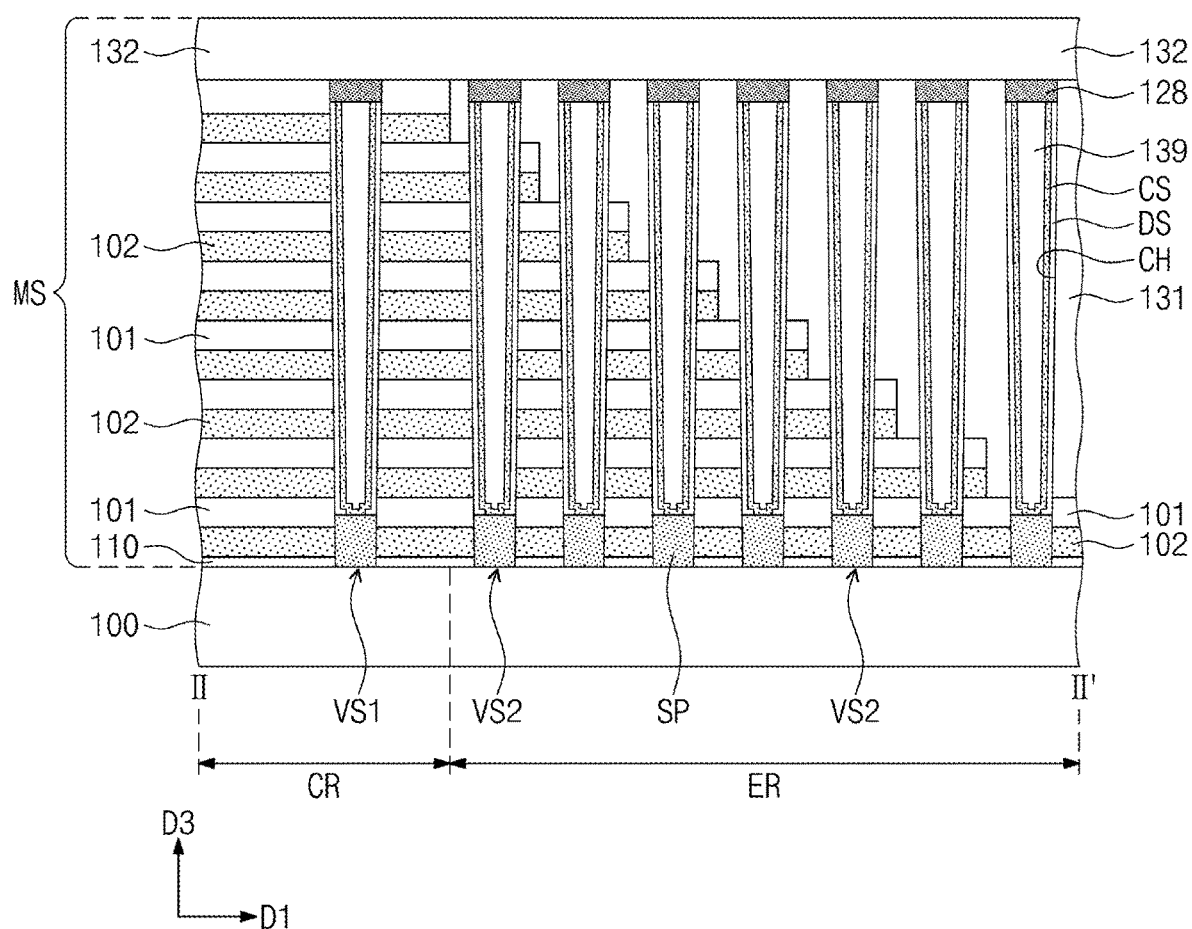
FIGS. 7B, 9B, 10B, 12B, 14B and 16B are cross-sectional views taken along lines II-IF of FIGS. 6, 8 and 15.
Figure 8:
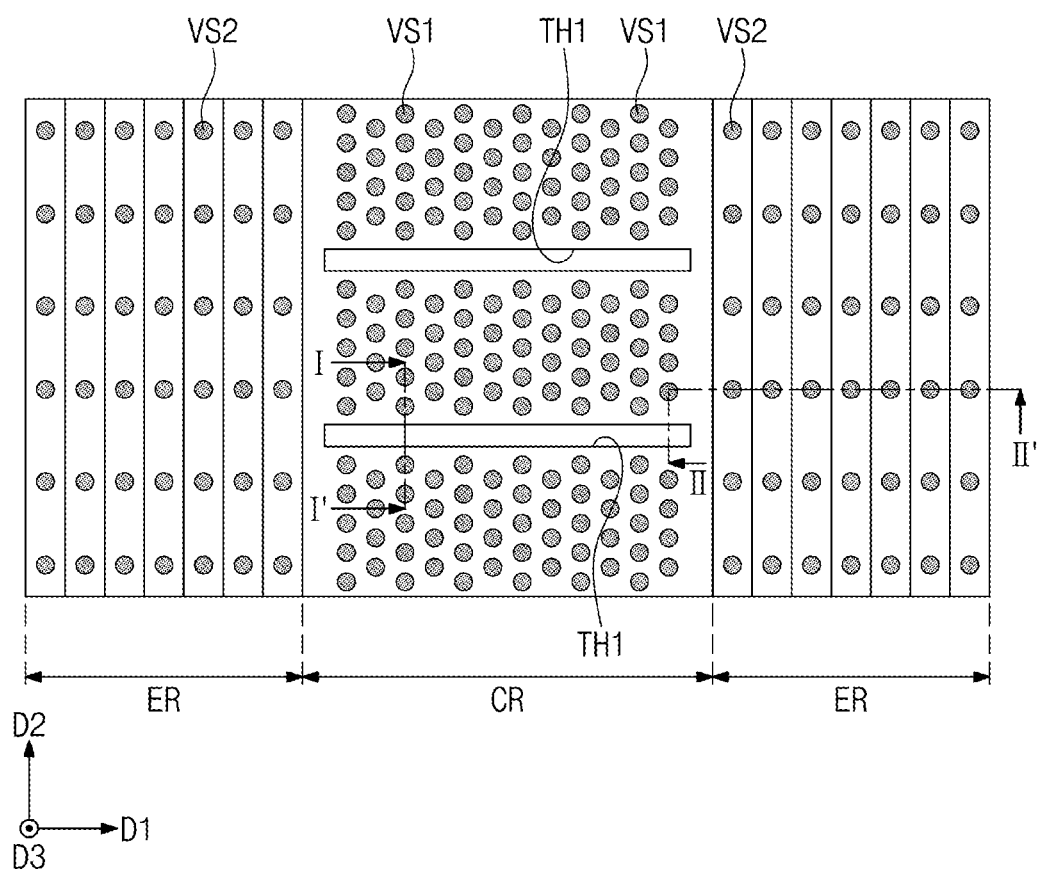
Figure 14A:
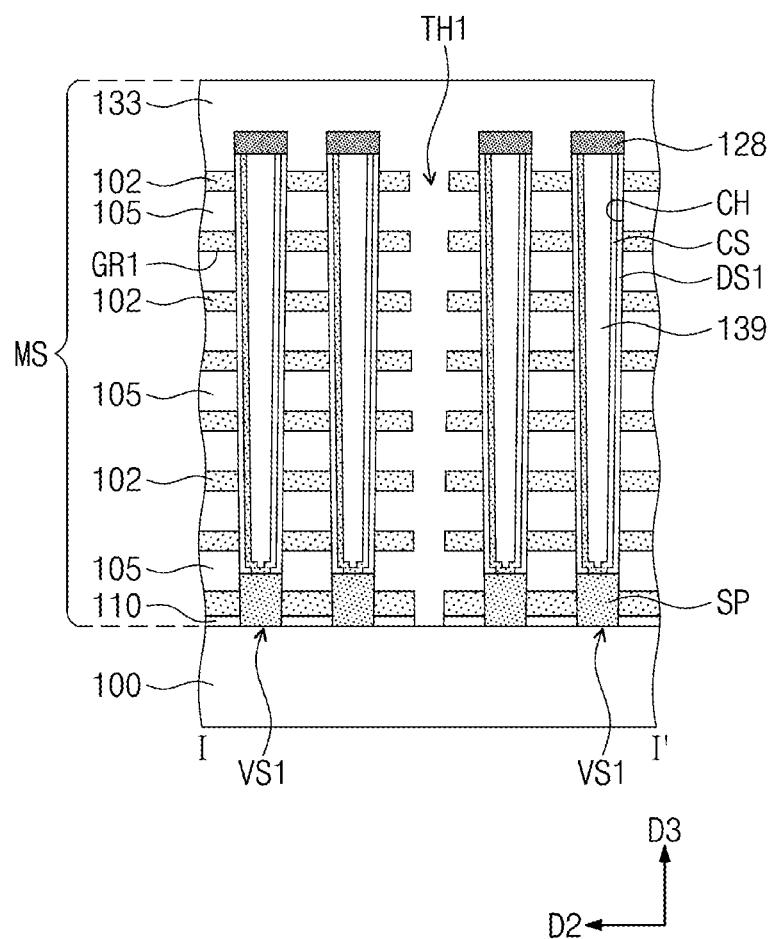
Figure 14B:
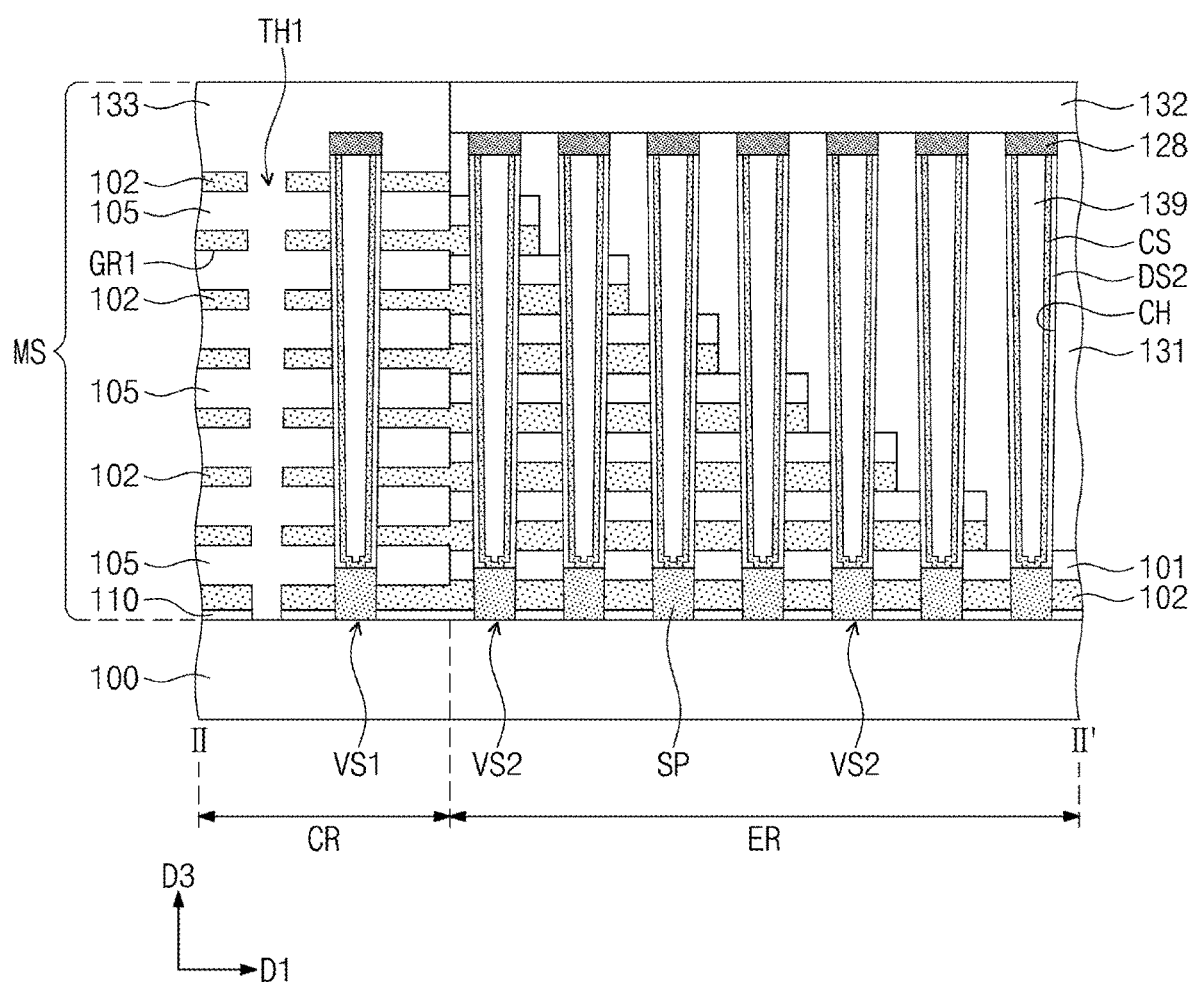
Figure 15:
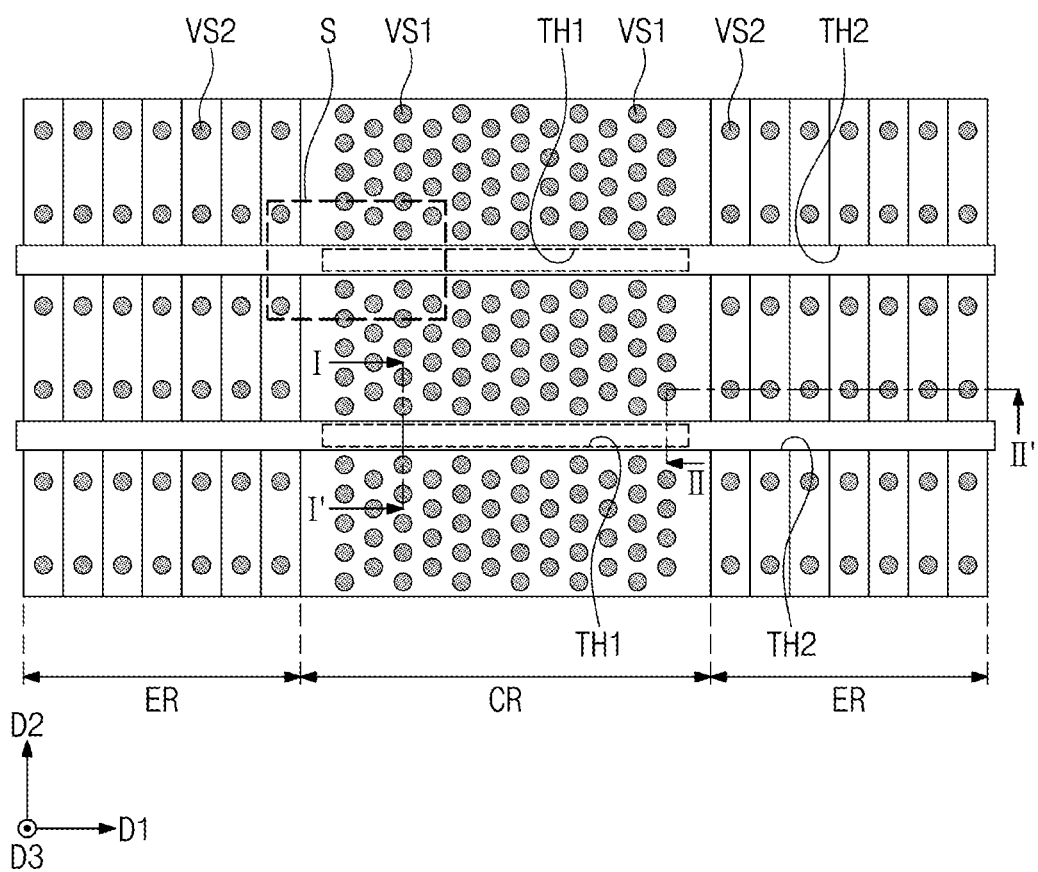
Figure 16A:
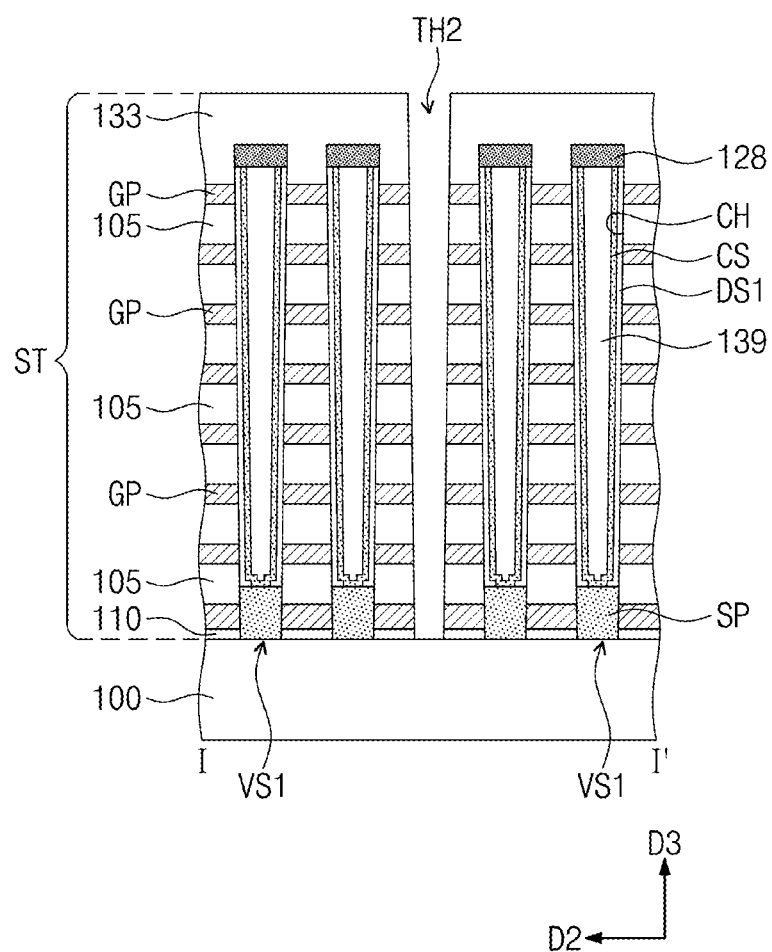
Figure 16B:
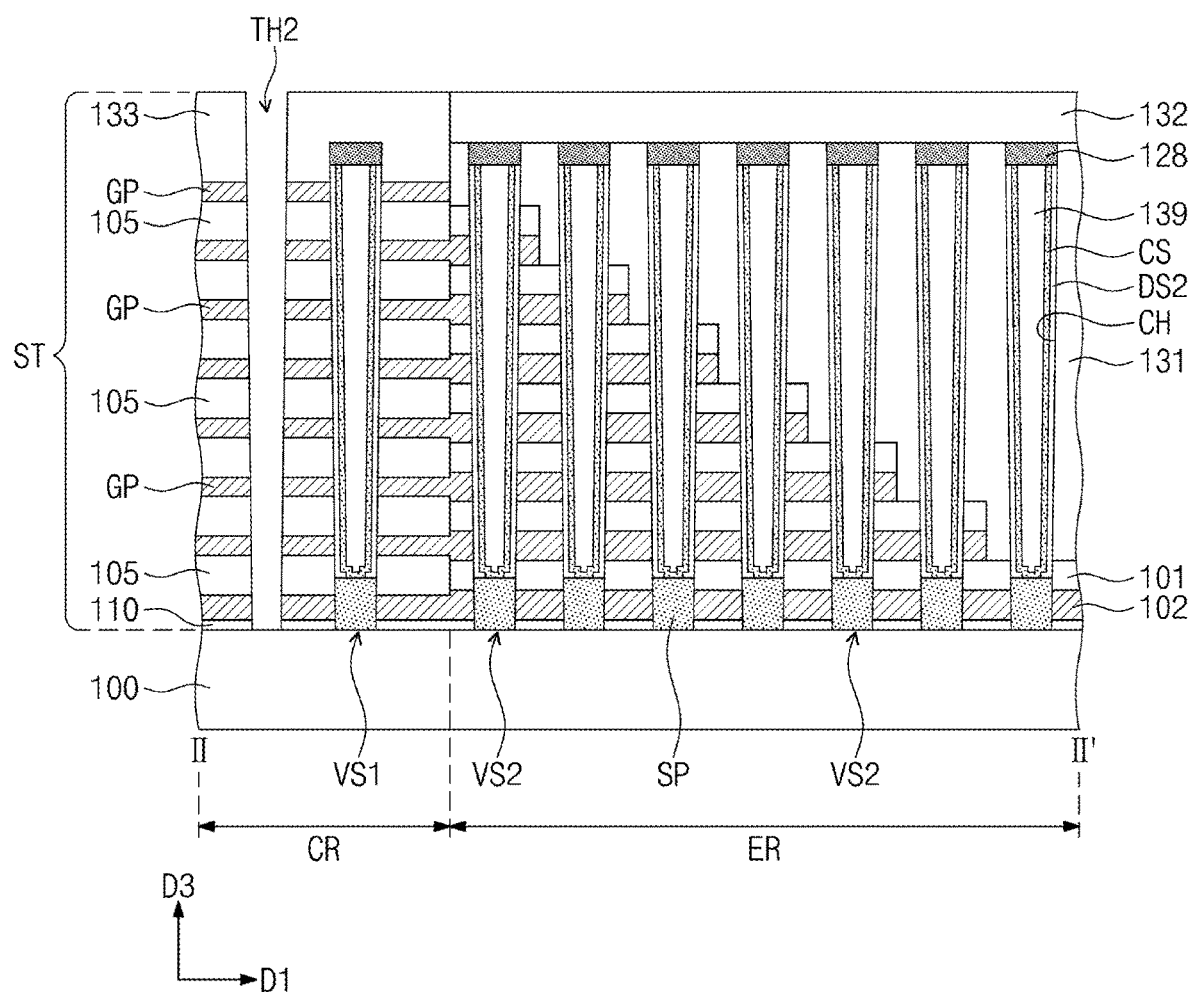
Figure 17:
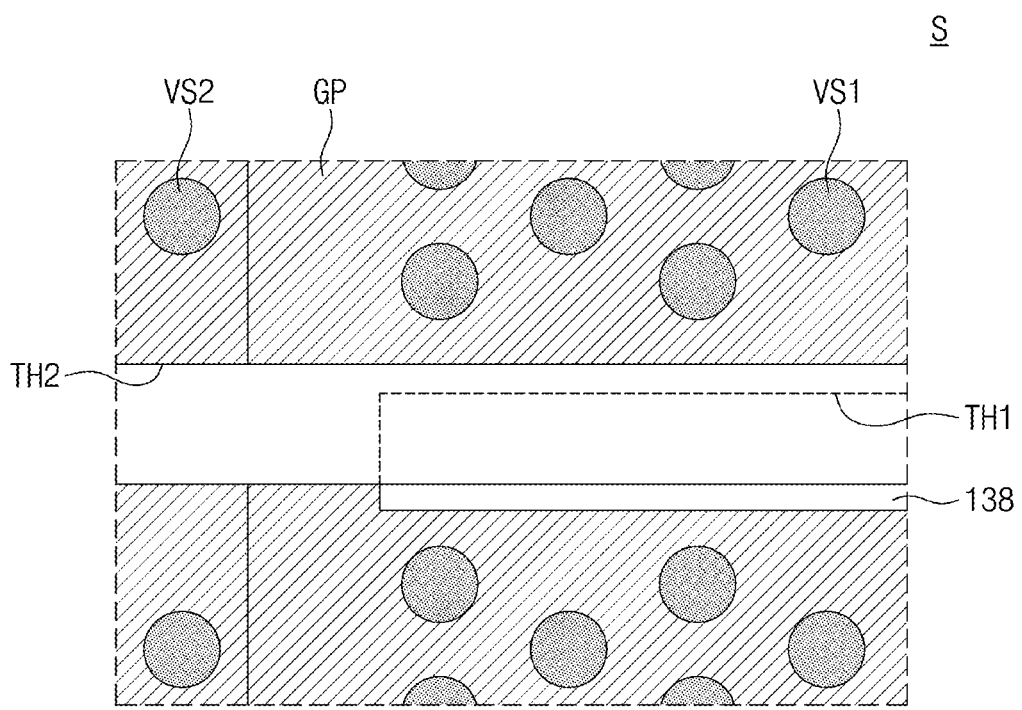
FIG. 17 is an enlarged view of a region 'S' of FIG. 15.

FIGS. 6, 8 and 15 are plan views illustrating a method of manufacturing a semiconductor memory device according to some embodiments of the inventive concept. FIGS. 7A, 9A, 10A, 12A, 14A and 16A are cross-sectional views taken along lines I-I' of FIGS. 6, 8 and 15. FIGS. 7B, 9B, 10B, 12B, 14B and 16B are cross-sectional views taken along lines II-IF of FIGS. 6, 8 and 15. FIGS. 11, 13A, 13B and 13C are enlarged views of regions 'R' of FIGS. 10B and 12B. FIG. 17 is an enlarged view of a region 'S' of FIG. 15.

Referring to FIGS. 6, 7A and 7B, a mold structure MS may be formed on a substrate 100 including a cell array region CR and an extension region ER. The mold structure MS may include first layers and second layers, which are alternately and repeatedly stacked on the substrate 100. For example, the first layers may be first horizontal insulating layers 101, and the second layers may be sacrificial layers 102. The first horizontal insulating layers 101 may include a material having an etch selectivity with respect to the sacrificial layers 102. For example, the first horizontal insulating layers 101 may be silicon oxide layers, and the sacrificial layers 102 may be silicon nitride layers. A buffer layer 110 may be formed at a bottom of the mold structure MS. The buffer layer 110 may be a silicon oxide layer.

The mold structure MS may be patterned to form a staircase structure on the extension region ER. The staircase structure may be formed by processes of forming a mask pattern and etching processes. A first interlayer insulating layer 131 on and at least partially covering the staircase structure may be formed.

Vertical holes CH may be formed to penetrate the mold structure MS. The vertical holes CH may expose the substrate 100, i.e., portions of the substrate 100 may be free of the mold structure MS. For example, the vertical holes CH may be formed using an anisotropic etching process. A mask pattern may be formed on the mold structure MS, and the vertical holes CH may be formed by etching the mold structure MS exposed by the mask pattern. The etching process for forming the vertical holes CH may be performed until portions of the top surface of the substrate 100 are exposed, i.e., are free of the mold structure. The top surface of the substrate 100 may be recessed by over-etching of the etching process.

The vertical holes CH may be formed on both the cell array region CR and the extension region ER. Semiconductor pillars SP may be formed or grown from the top surface of the substrate 100 exposed by the vertical holes CH. For example, the semiconductor pillars SP may include an intrinsic semiconductor material or a P-type semiconductor material. In some embodiments, the semiconductor pillars SP may be omitted.

Vertical structures VS1 and VS2 may be formed on the semiconductor pillars SP in the vertical holes CH. First vertical structures VS1 on the cell array region CR and second vertical structures VS2 on the extension region ER may be formed to have substantially the same layers and the same shape. Each of the vertical structures VS1 and VS2 may include a filling layer 139, a channel layer CS, a data storage layer DS, and a pad pattern 128. The channel layer CS may penetrate the data storage layer DS so as to be connected to the semiconductor pillar SP. In more detail, the data storage layer DS may be formed on inner surfaces of the vertical holes CH. Thereafter, lower portions of the data storage layer DS may be etched by a dry etching process to expose top surfaces of the semiconductor pillars SP, i.e., top surfaces of the semiconductor pillars SP may be free of the data storage layer DS. Next, the channel layer CS may be formed on sidewalls of the data storage layer DS. Lower portions of the channel layer CS may be connected to the semiconductor pillars SP. Subsequently, the filling layer 139 on and at least partially covering sidewalls of the channel layer CS may be formed in the vertical holes CH. The filling layer 139 may be formed using, for example, a spin-on-glass (SOG) technique. The filling layer 139 may include an insulating material, e.g., a silicon oxide layer or a silicon nitride layer. Upper portions of the data storage layer DS, the channel layer CS and the filling layer 139 may be removed to form empty regions in the vertical holes CH, and then, the pad patterns 128 may be formed in the empty regions with a conductive material. A second interlayer insulating layer 132 on and at least partially covering the vertical structures VS1 and VS2 may be formed. The second interlayer insulating layer 132 may include silicon oxide.

Figure 9A:
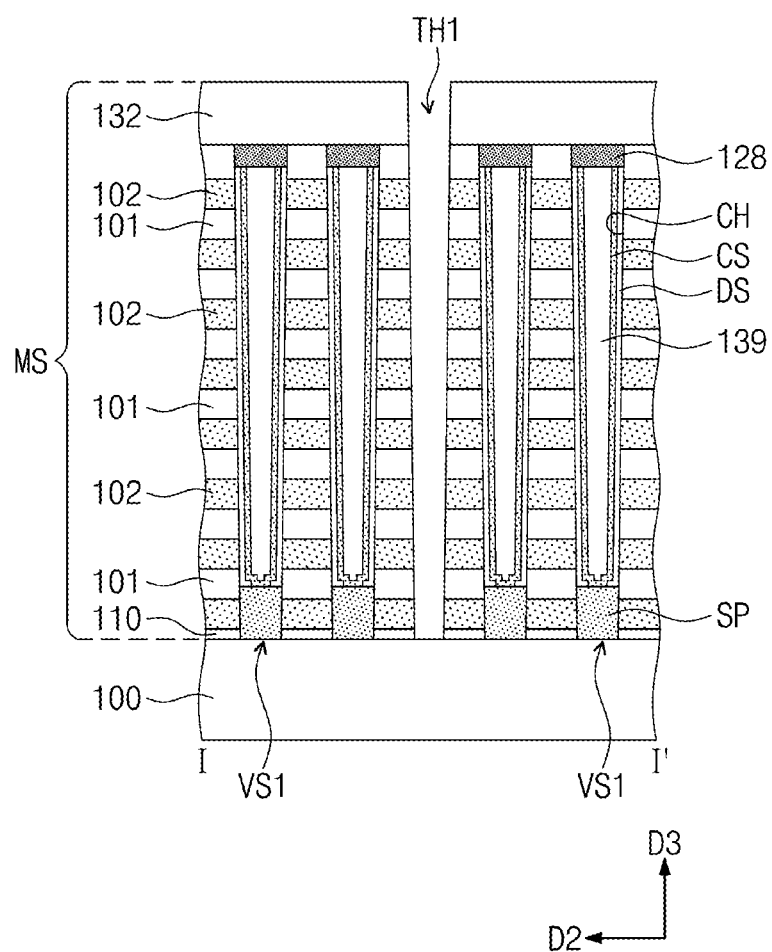
Figure 9B:
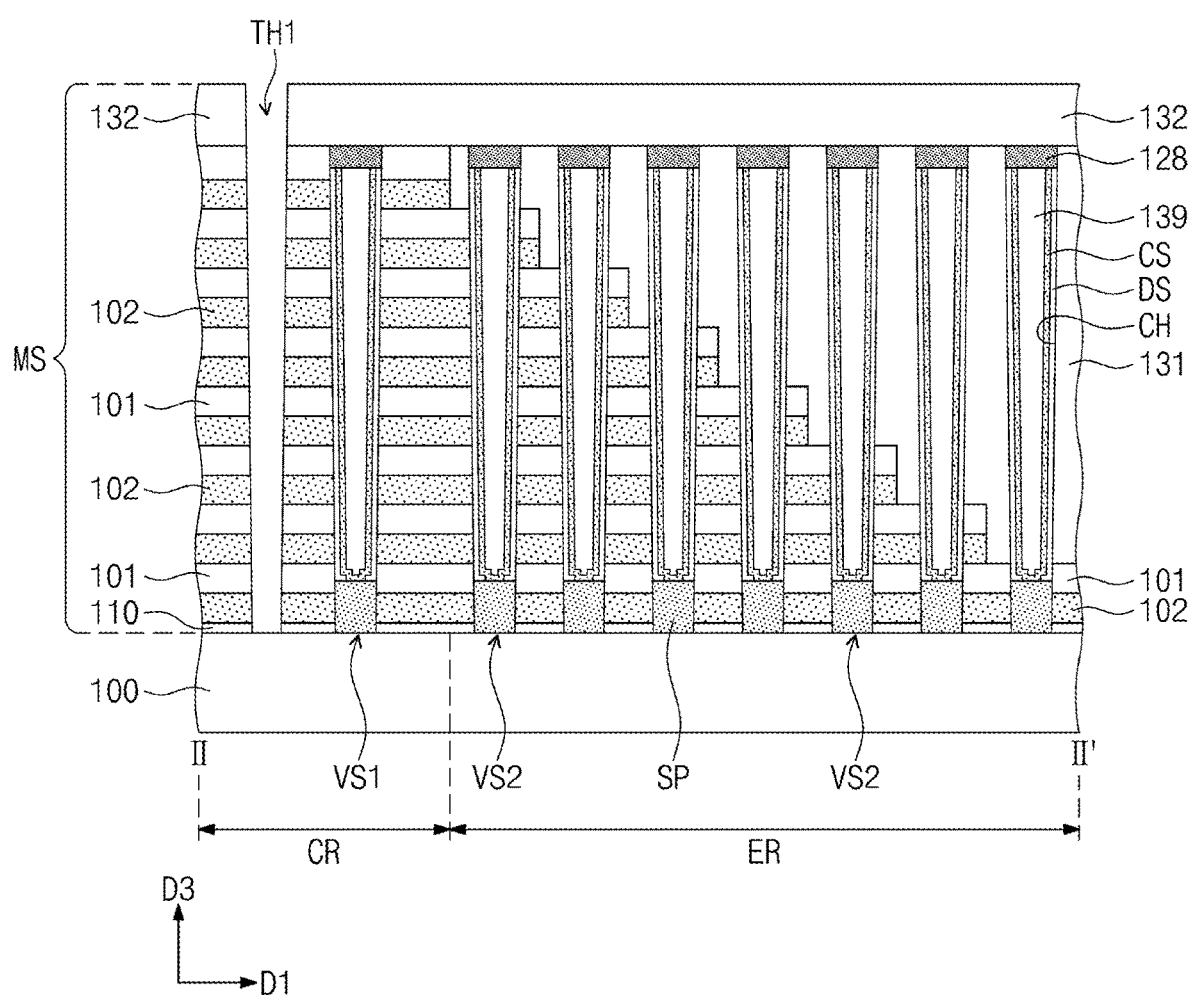

Referring to FIGS. 8, 9A and 9B, first trenches TH1 may be formed to penetrate the mold structure MS. The first trenches TH1 may expose, e.g., provide access to the top surface of the substrate 100. The first trenches TH1 may be formed using an ion beam etching process. The first trenches TH1 may be formed on the cell array region CA, and both end portions of each of the first trenches TH1 may be provided in the cell array region CR when viewed in a plan view (see, e.g., FIG. 8). The first trenches TH1 may extend in the first direction D1 and may be spaced apart from each other in the second direction D2.

Figure 10A:
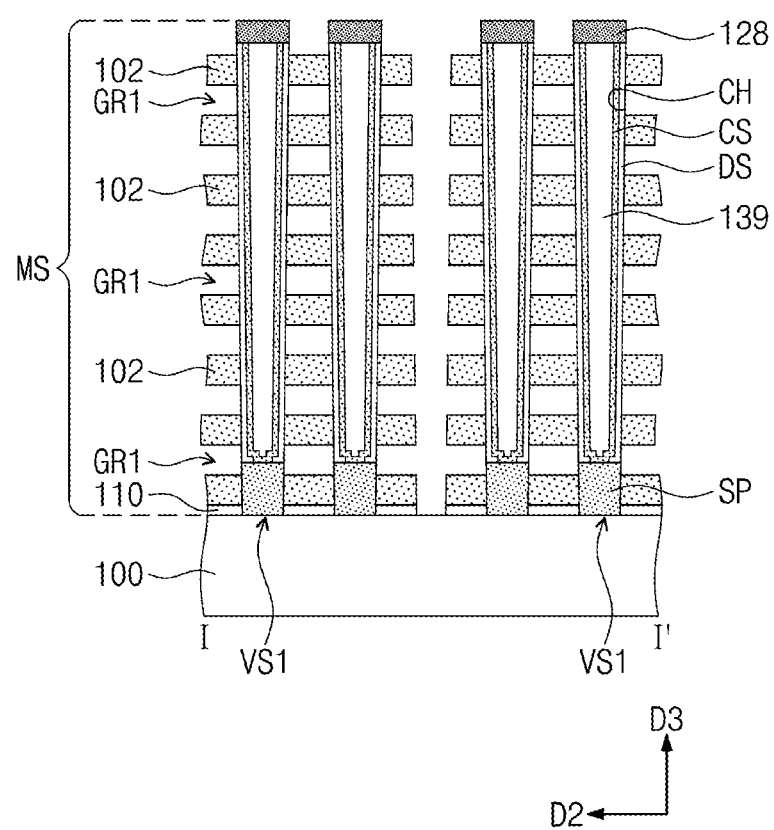
Figure 10B:
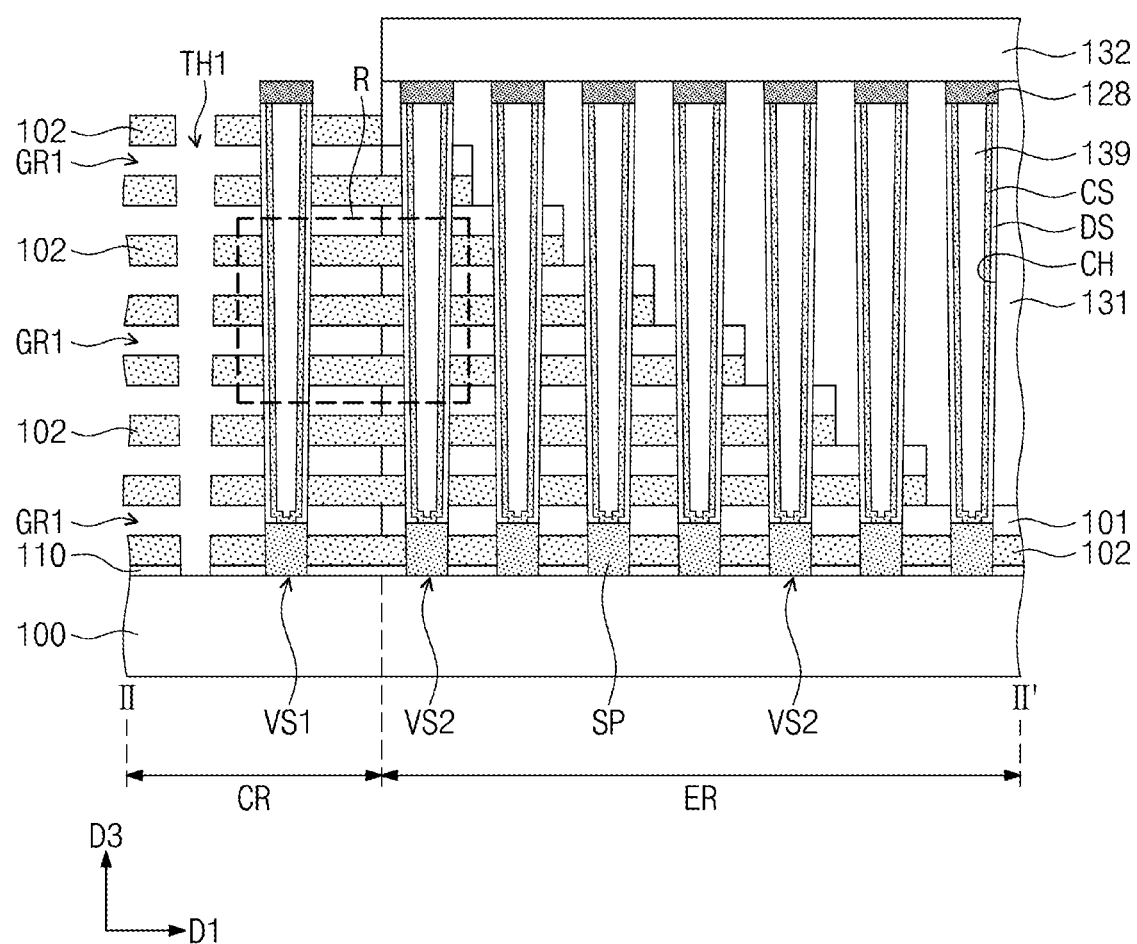

Referring to FIGS. 10A and 10B, the first horizontal insulating layers 101 exposed or revealed by the first trenches TH1 may be removed from the cell array region CR. The first horizontal insulating layers 101 of the cell array region CR may be removed using an isotropic etching process. The first horizontal insulating layers 101 may be removed using an etch recipe (e.g., hydrofluoric acid (HF)) having an etch selectivity with respect to the sacrificial layers 102. Thus, etching of the sacrificial layers 102 may be reduced or minimized during the etching process of the first horizontal insulating layers 101. On the cell array region CR, at least a portion of the second interlayer insulating layer 132 may be removed together with the first horizontal insulating layers 101. The first horizontal insulating layers 101 and the second interlayer insulating layer 132 on the extension region ER may not be removed, due to a distance from the first trenches TH1. First gap regions GR1 that expose the data storage layer DS between the sacrificial layers 102 and are connected to the first trenches TH1 may be formed by the removal of the first horizontal insulating layers 101 of the cell array region CR. Since the first trenches TH1 are confined on the cell array region CR and are not formed on the extension region ER, it is possible to reduce or minimize loss or damage of the second interlayer insulating layer 132 and the first interlayer insulating layer 131 on the extension region ER. As a result, processes of manufacturing the semiconductor memory device may be simplified and dispersion of a subsequent process of forming horizontal electrodes may be reduced.

Figure 11:
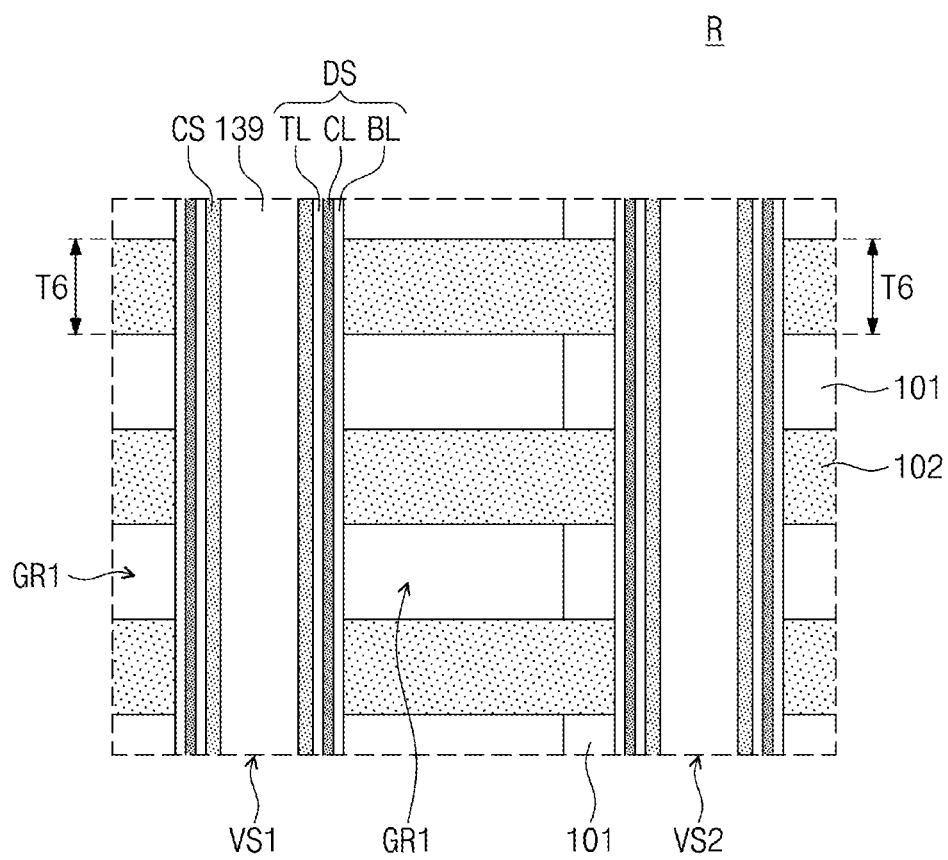
FIGS. 11, 13A, 13B and 13C are enlarged views of regions 'R' of FIGS. 10B and 12B.

FIG. 11 is an enlarged view of a region 'R' of FIG. 10B. Referring to FIG. 11, the first gap regions GR1 may be locally formed on the cell array region CR. The first horizontal insulating layers 101 may be on and at least partially cover the data storage layers DS of the second vertical structures VS2 disposed on the extension region ER.

Figure 12A:
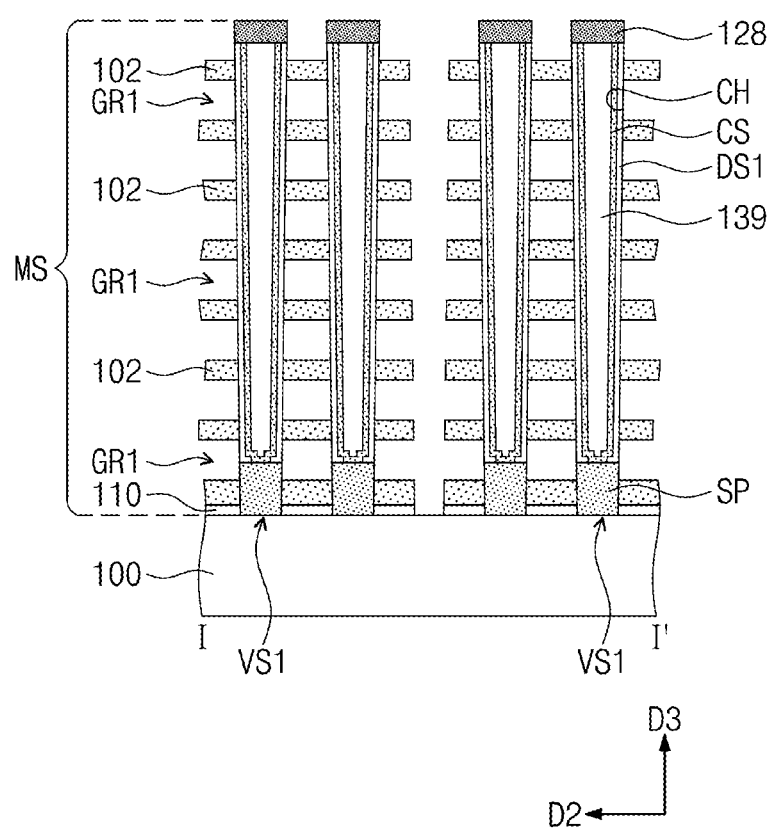
Figure 12B:
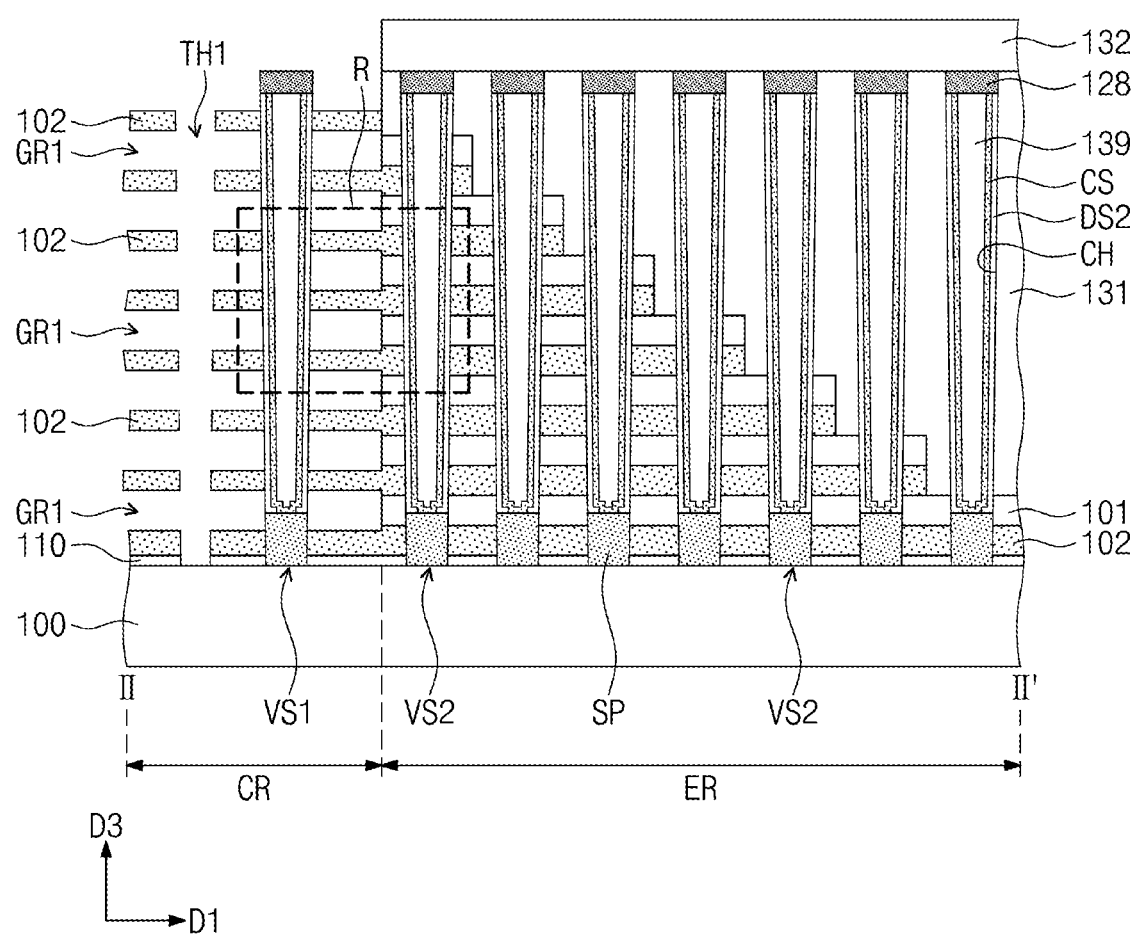

Referring to FIGS. 12A and 12B, an etching process may be performed on the data storage layer DS (hereinafter, referred to as a first data storage layer DS1) of the first vertical structure VS1. FIGS. 13A, 13B and 13C are enlarged views of a region 'R' of FIG. 12B.

Referring to FIGS. 12A, 12B and 13A, the blocking insulating layer of the first data storage layer DS1 may be etched to form blocking insulating patterns BP separated from each other in the third direction D3. The blocking insulating layer BL of the data storage layer DS (hereinafter, referred to as a second data storage layer DS2) of the second vertical structure VS2 may be at least partially covered by the first horizontal insulating layers 101 and thus may not be etched. The etching process for forming the blocking insulating patterns BP may be performed using an etch recipe (e.g., hydrofluoric acid (HF)) having an etch selectivity with respect to the sacrificial layers 102 and the charge storage layer CL. Thus, etching of the sacrificial layers 102 and the charge storage layer CL may be reduced or minimized during the formation of the blocking insulating patterns BP. Portions of the sacrificial layers 102, which are exposed by the first gap regions GR1, may have substantially the same thickness (e.g., a first thickness T6) as portions of the sacrificial layers 102, which are covered by the first horizontal insulating layers 101. Portions of the first horizontal insulating layers 101 exposed by the first gap regions GR1 and a portion of the second interlayer insulating layer 132 on the extension region ER may also be removed. As a result, a top surface of the second interlayer insulating layer 132 may be lower in the D3 direction than that of the second interlayer insulating layer 132 of FIG. 10B.

Referring to FIGS. 12A, 12B and 13B, the charge storage layer CL exposed between the blocking insulating patterns BP of the first data storage layer DS1 may be etched to form charge storage patterns CP separated from each other in the third direction D3. The charge storage layer CL of the second data storage layer DS2 of the second vertical structure VS2 may be at least partially covered by the first horizontal insulating layers 101 and, thus, may not be etched. The etching process for forming the charge storage patterns CP may be performed using an etch recipe (e.g., phosphoric acid ($H_3PO_4$)) having an etch selectivity with respect to the blocking insulating patterns BP and the tunneling insulating layer TL. A difference in etch rate between the charge storage layer CL and the sacrificial layers 102 may be less than a difference in etch rate between the charge storage layer CL and the blocking insulating patterns BP (and the tunneling insulating layer TL). As a result, top and bottom surfaces of the portions of the sacrificial layers 102 exposed or revealed by the first gap regions GR1 may be etched while the charge storage layer CL is etched, and, thus, the etched portions of the sacrificial layers 102 may have a second thickness T7 less than the first thickness T6. The first thickness T6 of the portions of the sacrificial layers 102 at least partially covered by the first horizontal insulating layers 101 may be maintained. As a result, stepped structures may be formed at the tops and bottoms of the sacrificial layers 102.

In some embodiments, such as the embodiments of FIG. 13C, the tunneling insulating layer TL exposed or revealed between the charge storage patterns CP of the first data storage layer DS1 may be etched to form tunneling insulating patterns TP separated from each other in the third direction D3. In some embodiments, the tunneling insulating layer TL of the second data storage layer DS2 of the second vertical structure VS2 may be at least partially covered by the first horizontal insulating layers 101 and, thus, may not be etched. Hereinafter, example embodiments of the inventive concept will be described with reference to FIG. 13B.

Referring to FIGS. 14A and 14B, a gap-fill insulating layer (hereinafter, referred to as a first separation pattern) 133 may be formed to fill the first trenches TH1 and the first gap regions GR1 extending from the first trenches TH1. Hereinafter, portions of the first separation pattern 133 which are in the first gap regions GR1 may be referred to as second horizontal insulating layers 105. For example, the first separation pattern 133 may include silicon oxide.

Referring to FIGS. 15, 16A, 16B and 17, second trenches TH2 may be formed to penetrate the mold structure MS. The second trenches TH2 may expose the top surface of the substrate 100, i.e., at least portions of the top surface of the substrate are free of the mold structure MS. For example, the second trenches TH2 may be formed using an ion beam etching process. Each of the second trenches TH2 may be formed on the cell array region CR and the extension region ER. In other words, each of the second trenches TH2 may intersect the cell array region CR and the extension region ER. The second trenches TH2 may extend in the first direction D1 and may be spaced apart from each other in the second direction D2. The second trenches TH2 may overlap with the first trenches TH1, respectively. In some embodiments, a portion of sidewalls of the second trenches TH2 may not be aligned with the first trenches TH1, and, thus, a portion of the first trench TH1 and a protrusion separation pattern 138 in the portion of the first trench TH1 may remain. The protrusion separation pattern 138 corresponding to a portion of a remaining first separation pattern 133 may be in contact with sidewalls of the sacrificial layers 102 between the second horizontal insulating layers 105.

The sacrificial layers 102 exposed or revealed through the second trenches TH2 may be replaced with horizontal electrodes GP. For example, the sacrificial layers 102 exposed through the second trenches TH2 may be selectively removed to form second gap regions, and the horizontal electrodes GP may be formed in the second gap regions, respectively. The formation of the horizontal electrodes GP may include forming a conductive layer in the second gap regions, and performing an etching process on the conductive layer to remove the conductive layer formed in the second trenches TH2 and to locally leave portions of the conductive layer in the second gap regions, respectively.

A process of forming the barrier insulating layer 160 illustrated in FIG. 4 may be performed before the formation of the horizontal electrodes GP. The barrier insulating layer 160 may be formed on to at least partially conformally cover top surfaces and bottom surfaces of the second horizontal insulating layers 105 exposed or revealed by the second gap regions. The barrier insulating layer 160 may include a single layer or a plurality of layers. For example, the barrier insulating layer 160 may be a portion of a blocking insulating layer of a charge trap-type non-volatile memory transistor. The barrier insulating layer 160 may be a dielectric layer (e.g., a high-k material such as aluminum oxide ($Al_2O_3$), hafnium oxide ($HfO_2$), zirconium oxide ($ZrO_2$), hafnium-aluminum oxide (HfAlO), and/or hafnium-silicon oxide (HfSiO)). Stack structures ST including the horizontal electrodes GP and the horizontal insulating layers 105 and 101 may be formed by the formation of the horizontal electrodes GP.

Referring again to FIGS. 2, 3A and 3B, source regions SR may be formed in the substrate 100 exposed or revealed through the second trenches TH2. The source region SR may be formed using an ion implantation process. The source region SR may have a different conductivity type from that of the substrate 100. A second separation pattern 134 and a source line SL may be sequentially formed in each of the second trenches TH2. For example, the second separation patterns 134 may be formed on and at least partially cover sidewalls of the second trenches TH2. The formation of the second separation patterns 134 may include forming an insulating layer (not shown) on and at least partially covering the sidewalls and bottom surfaces of the second trenches TH2, and etching portions of the insulating layer (not shown), which are on and at least partially cover the bottom surfaces of the second trenches TH2, to expose or reveal the top surface of the substrate 100, i.e., portions of the top surface of the substrate may be free of insulating layer. The second separation patterns 134 may be formed of, for example, silicon oxide or silicon nitride. The source line SL may be in each of the second trenches TH2 in which the second separation patterns 134 are formed. The source line SL may be formed using, for example, a chemical vapor deposition (CVD) process, a physical vapor deposition (PVD) process, and/or an atomic layer deposition (ALD) process. For example, the source line SL may be formed of a metal (e.g., tungsten, copper, and/or aluminum) and/or a transition metal (e.g., titanium and/or tantalum).

A third interlayer insulating layer 135 may be formed after the formation of the source line SL. The third interlayer insulating layer 135 may be on and at least partially cover the top surface of the first separation pattern 133 and the top surface of the second interlayer insulating layer 132. The third interlayer insulating layer 135 may include an insulating material, such as a silicon oxide layer, a silicon nitride layer, and/or a silicon oxynitride layer.

Contact plugs CT may be formed to penetrate the third interlayer insulating layer 135. The contact plugs CT may be in physical contact with the pad patterns 128. The contact plugs CT may include doped silicon and/or a conductive material (e.g., tungsten (W), copper (Cu), and/or aluminum (Al)).

Bit lines 176 being in physical contact with the contact plugs CT may be formed on the third interlayer insulating layer 135. The bit lines 176 may intersect the stack structures ST, and each of the bit lines 176 may be connected to the first vertical structures VS1 arranged in the second direction D2. The bit lines 176 may include a conductive material (e.g., tungsten (W), aluminum (Al), and/or copper (Cu)).

Figure 18A:
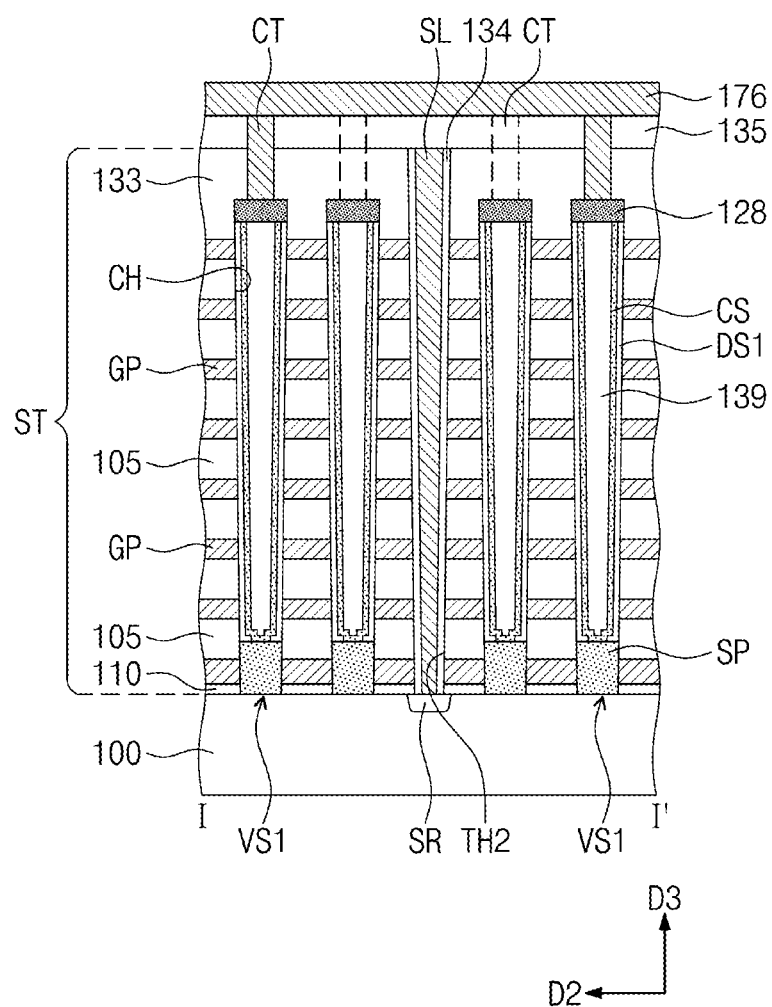
FIGS. 18A and 18B are cross-sectional views taken along the lines I-I' and II-II' of FIG. 2, respectively, to illustrate a semiconductor memory device according to some embodiments of the inventive concept.
Figure 18B:
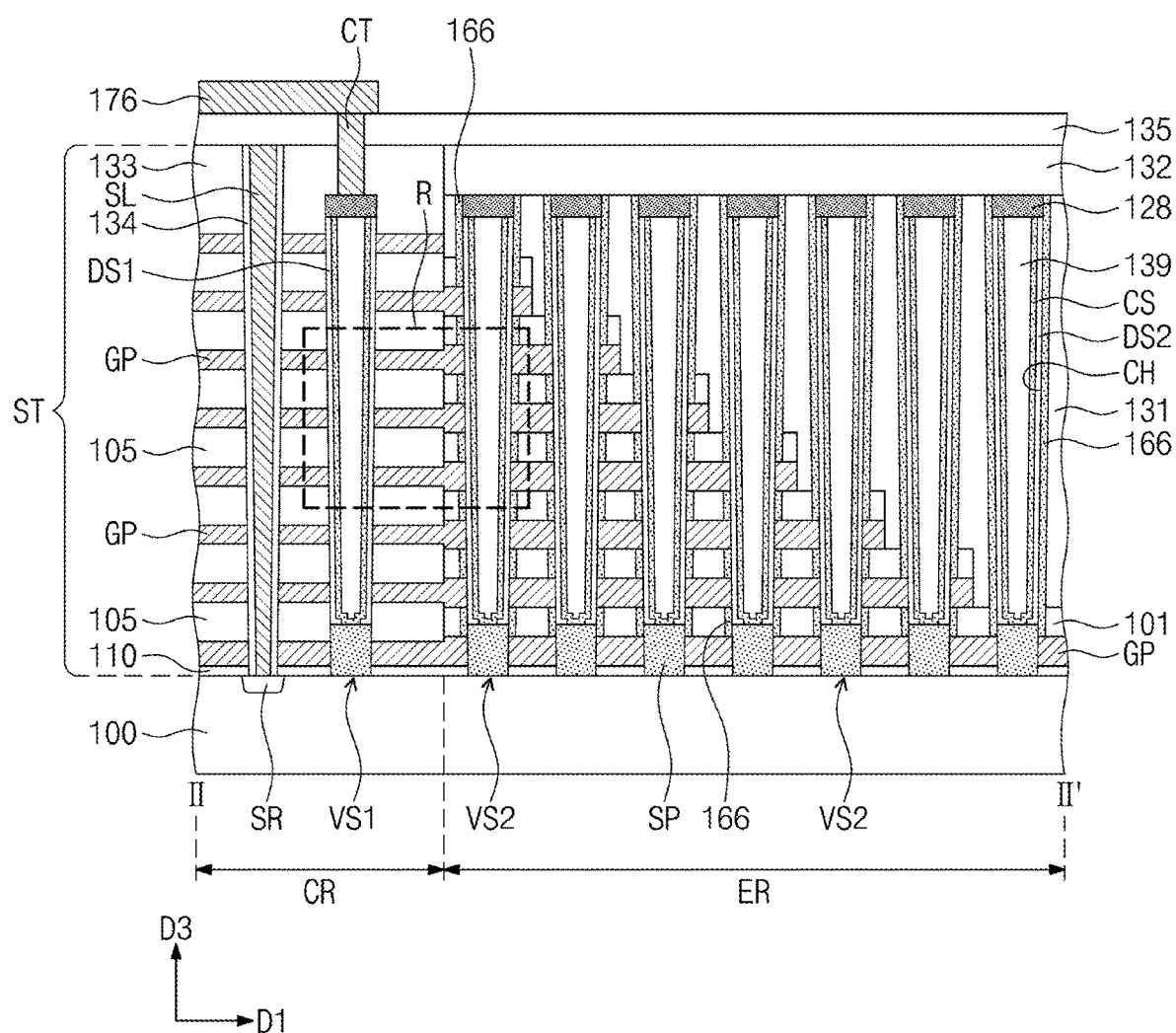
Figure 19:
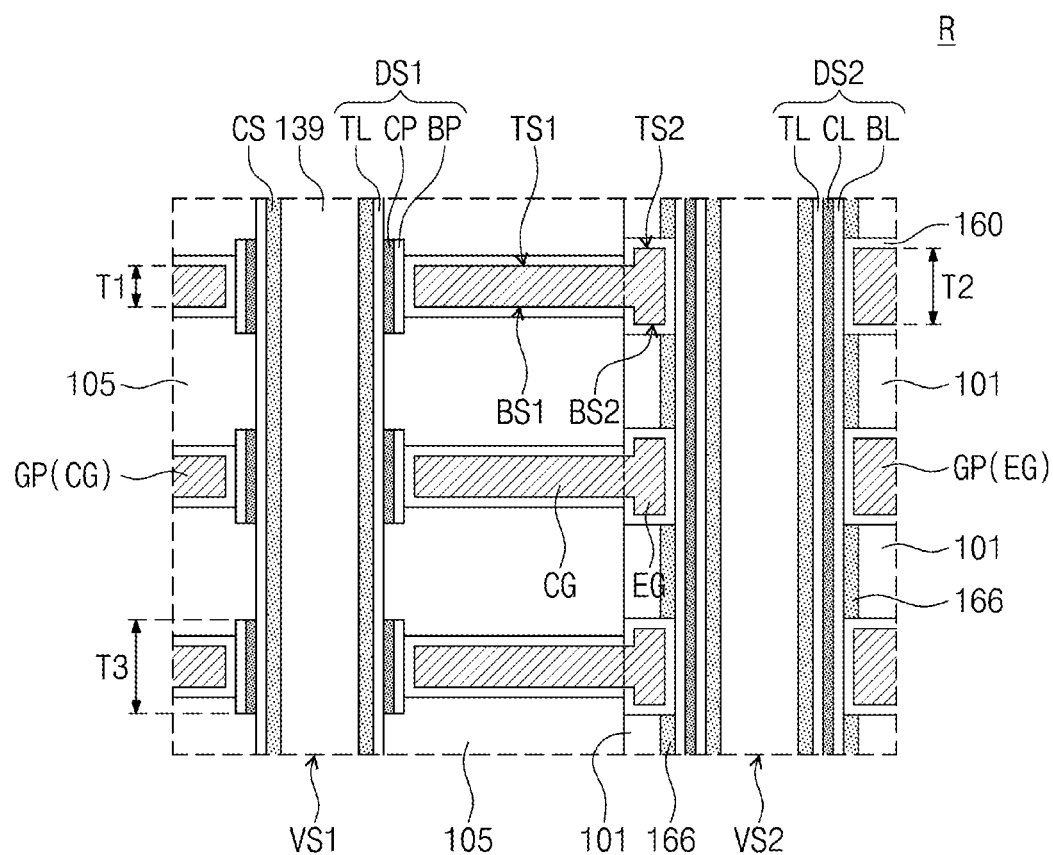
FIG. 19 is an enlarged view of a region 'R' of FIG. 18B.

FIGS. 18A and 18B are cross-sectional views taken along the lines I-I' and II-IF of FIG. 2, respectively, to illustrate a semiconductor memory device according to some embodiments of the inventive concept. FIG. 19 is an enlarged view of a region 'R' of FIG. 18B. Hereinafter, the descriptions of the same components as in the above embodiments will be omitted for the purpose of ease and convenience in explanation.

Referring to FIGS. 18A, 18B and 19, a semiconductor memory device, according to some embodiments, may include protective semiconductor patterns 166 provided on sidewalls of the second vertical structures VS2. The protective semiconductor patterns 166 may be provided locally on the extension region ER but may not be provided on sidewalls of the first vertical structures VS1 disposed on the cell array region CR. The protective semiconductor patterns 166 may be spaced apart from each other with the horizontal electrodes GP interposed therebetween. In other words, the protective semiconductor patterns 166 disposed on the sidewall of one of the second vertical structures VS2 may be separated from each other by the horizontal electrodes GP. For example, each of the protective semiconductor patterns 166 separated from each other by the horizontal electrodes GP may have a ring shape when viewed in a plan view. The protective semiconductor patterns 166 may be provided between the blocking insulating layer BL of the second data storage layer DS2 and the first horizontal insulating layers 101. The protective semiconductor patterns 166 may include a semiconductor material, such as poly-crystalline silicon.

Figure 20A:
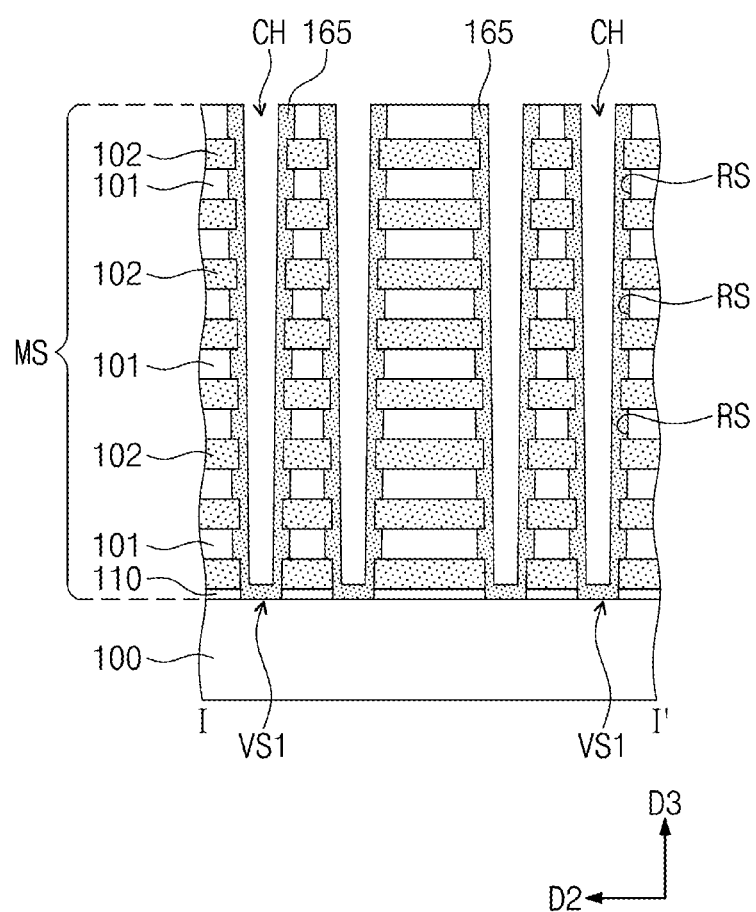
FIGS. 20A and 21A are cross-sectional views taken along the line I-I' of FIG. 2 to illustrate a method of manufacturing a semiconductor memory device, according to some embodiments of the inventive concept.
Figure 20B:
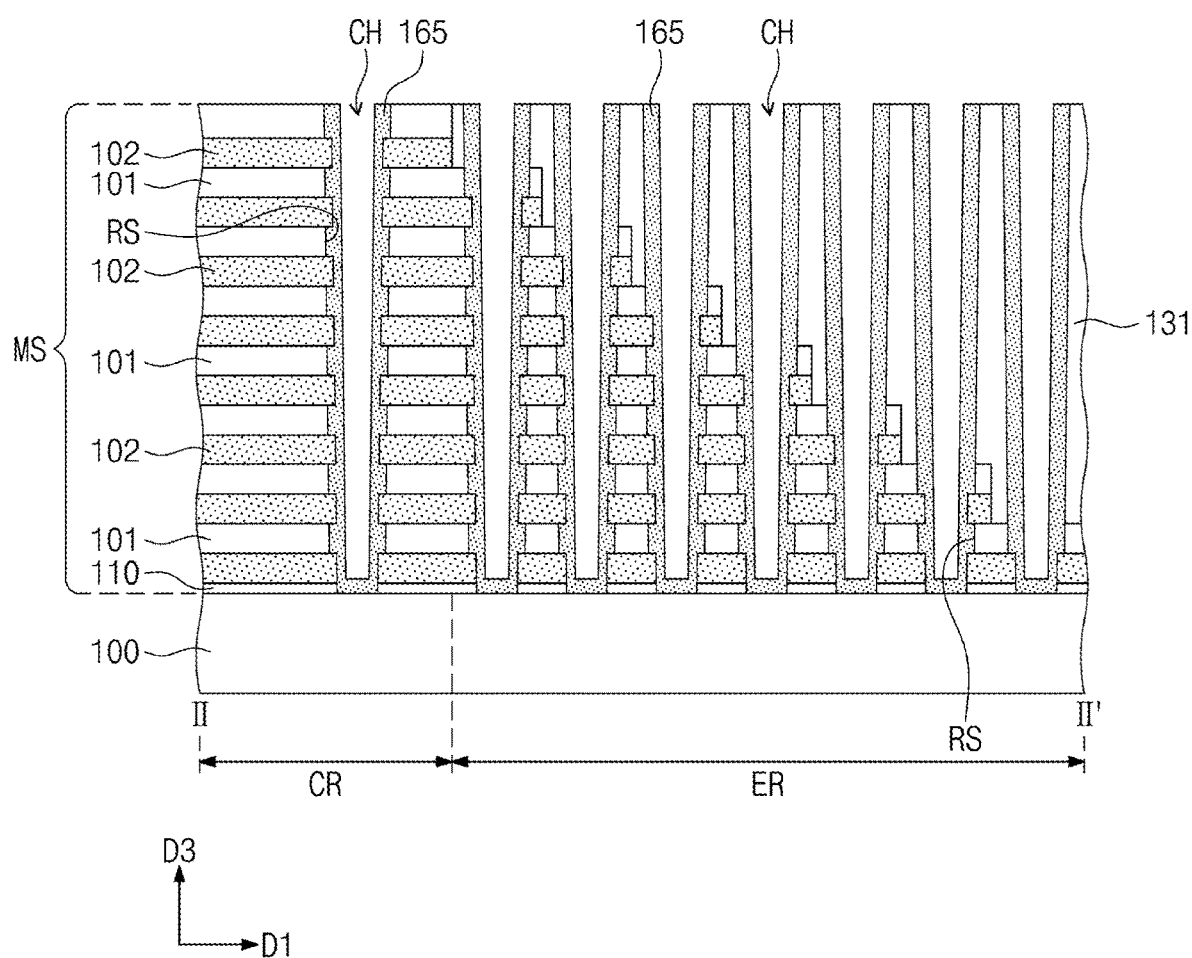
FIGS. 20B and 21B are cross-sectional views taken along the line II-IF of FIG. 2 to illustrate a method of manufacturing a semiconductor memory device, according to some embodiments of the inventive concept.
Figure 21A:
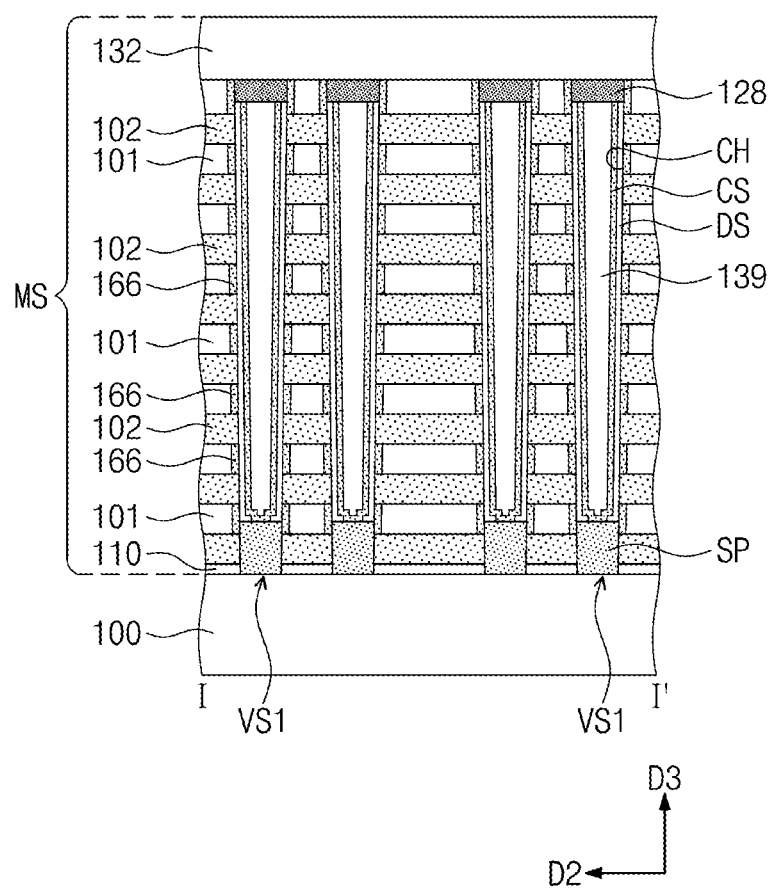
Figure 21B:
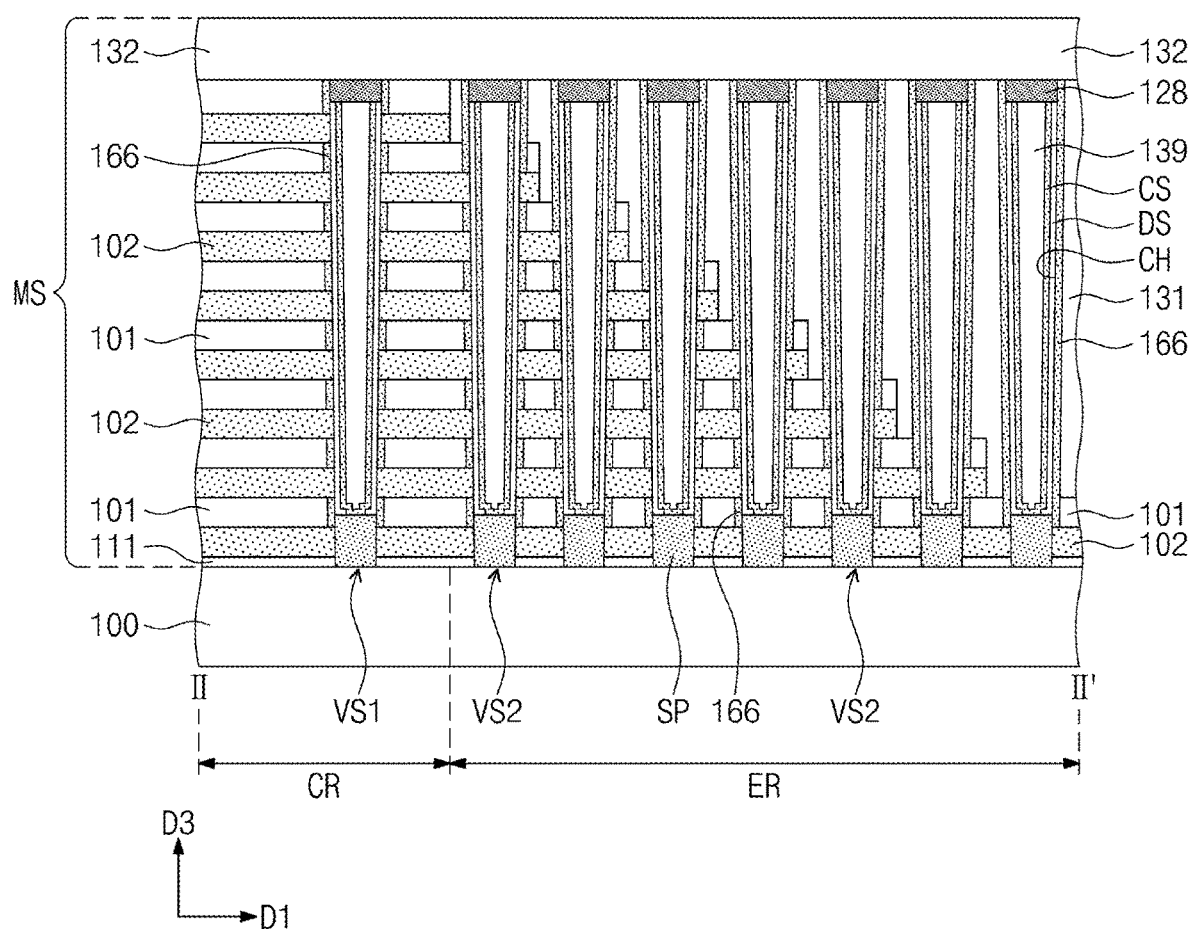
Figure 22A:
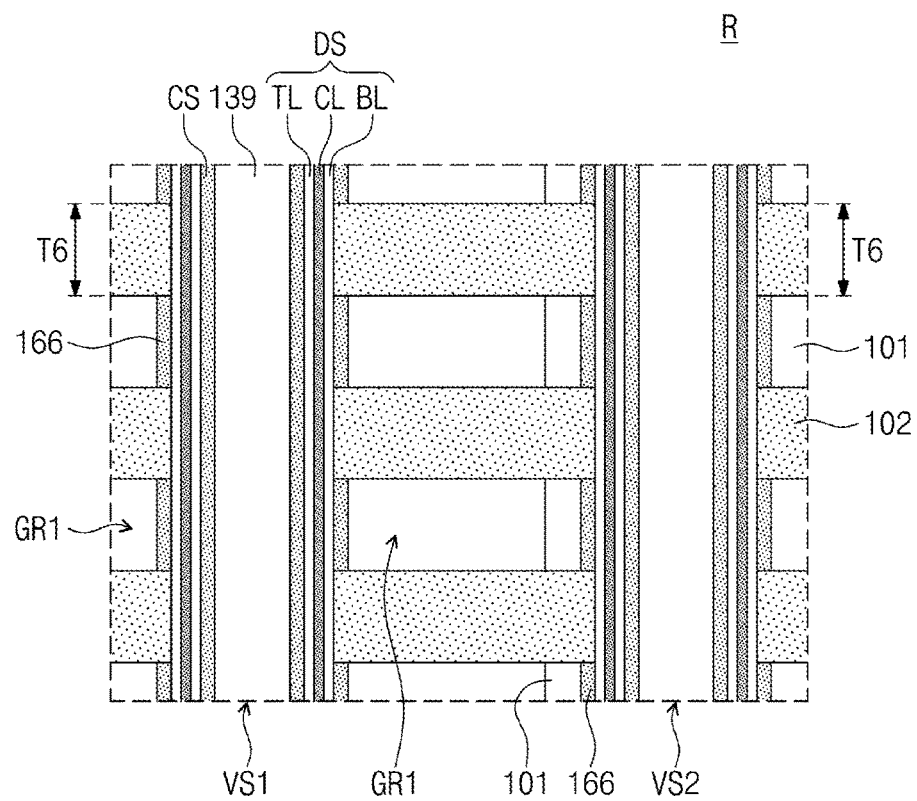
FIGS. 22A and 22B are enlarged views corresponding to FIGS. 11 and 13B, respectively.
Figure 22B:
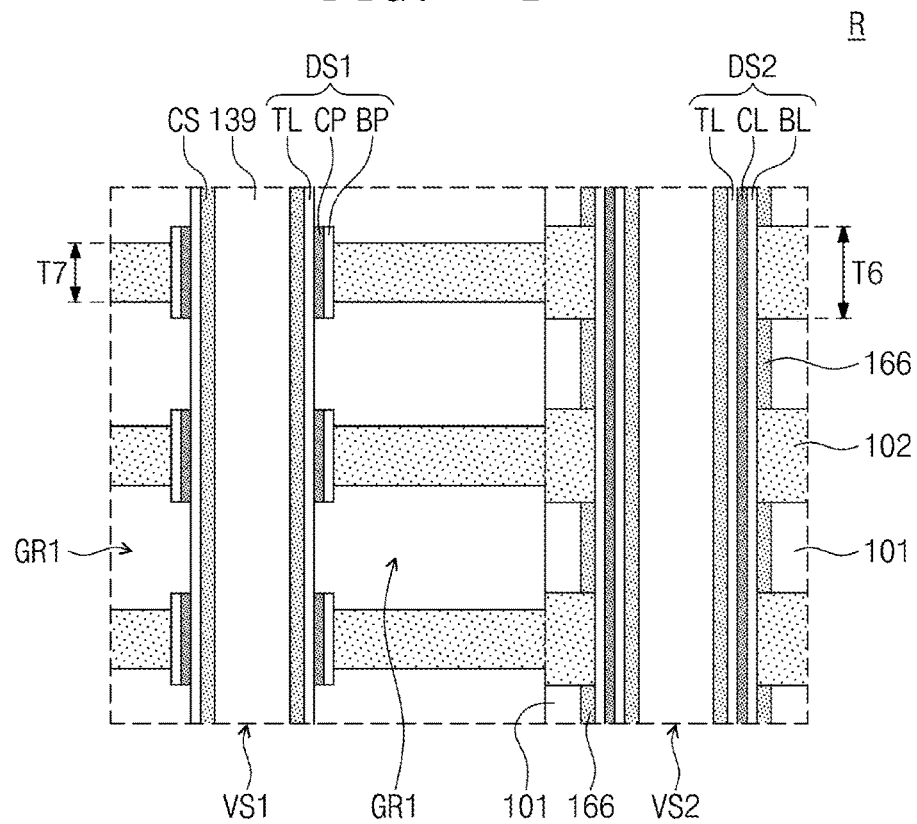

FIGS. 20A and 21A are cross-sectional views taken along the line I-I' of FIG. 2 to illustrate a method of manufacturing a semiconductor memory device, according to some embodiments of the inventive concept. FIGS. 20B and 21B are cross-sectional views taken along the line II-IF of FIG. 2 to illustrate a method of manufacturing a semiconductor memory device, according to some embodiments of the inventive concept. FIGS. 22A and 22B are enlarged views corresponding to FIGS. 11 and 13B, respectively.

Referring to FIGS. 20A and 20B, the mold structure MS including the first horizontal insulating layers 101 and the sacrificial layers 102, which are alternately and repeatedly stacked, may be provided on the substrate 100. The mold structure MS may include the staircase structure on the extension region ER. The first interlayer insulating layer 131 on and at least partially covering the staircase structure may be provided.

After forming the vertical holes CH which penetrate the mold structure MS to expose or reveal portions of the substrate 100 surface, portions of the first horizontal insulating layers 101 exposed or revealed by the vertical holes CH may be removed to form recess regions RS on the cell array region CR and the extension region ER. Each of the recess regions RS may be a region defined by adjacent sacrificial layers 102 and a sidewall of the first horizontal insulating layer 101 between the adjacent sacrificial layers 102. The recess regions RS may be formed using an etch recipe (e.g., hydrofluoric acid (HF)) having an etch selectivity with respect to the sacrificial layers 102. The first interlayer insulating layer 131 may be etched together with the first horizontal insulating layers 101.

A protective semiconductor layer 165 in the recess regions RS may be formed in the vertical holes CH. In some embodiments, the protective semiconductor layer 165 may be formed of a material having an etch selectivity with respect to the first horizontal insulating layers 101 and the sacrificial layers 102. For example, the protective semiconductor layer 165 may be a poly-silicon layer. The protective semiconductor layer 165 may have a bent or uneven inner surface due to the recess regions RS.

Referring to FIGS. 21A and 21B, a process of trimming the protective semiconductor layer 165 may be performed to form separated protective semiconductor patterns 166 in the recess regions RS, respectively. For example, the trimming process may include a wet etching process. Thereafter, the semiconductor pillars SP and the vertical structures VS1 and VS2 may be formed in the vertical holes CH as described with reference to FIGS. 6, 7A and 7B.

FIG. 22A is an enlarged view of a region corresponding to FIG. 11 to illustrate a structure obtained by performing the example processes described with reference to FIGS. 8, 9A, 9B, 10A and 10B on the resultant structure of FIGS. 21A and 21B. Referring to FIG. 22A, the data storage layer DS on the cell array region CR may be protected by the protective semiconductor patterns 166 while the first horizontal insulating layers 101 exposed or revealed by the first trenches TH1 are removed from the cell array region CR. As a result, damage to the data storage layer DS on the cell array region CR may be reduced or prevented.

FIG. 22B is an enlarged view of a region corresponding to FIG. 13B to illustrate a structure obtained by performing the example processes described with reference to FIGS. 12A, 12B, 13A and 13B on the resultant structure of FIG. 22A. The protective semiconductor patterns 166 on the cell array region CR may be removed by the processes described with reference to FIGS. 12A, 12B, 13A and 13B, but the protective semiconductor patterns 166 on the extension region ER may be at least partially covered by the first horizontal insulating layers 101 and the interlayer insulating layers 131 and 132 and, thus, may remain. As a result, the semiconductor memory device, according to some embodiments, may include the protective semiconductor patterns 166 provided on the sidewalls of the second vertical structures VS2. Thereafter, the example processes of FIGS. 14A, 14B, 16A and 16B may be performed to manufacture the semiconductor memory device according to the embodiments described with reference to FIGS. 18A and 18B.

Figure 23:
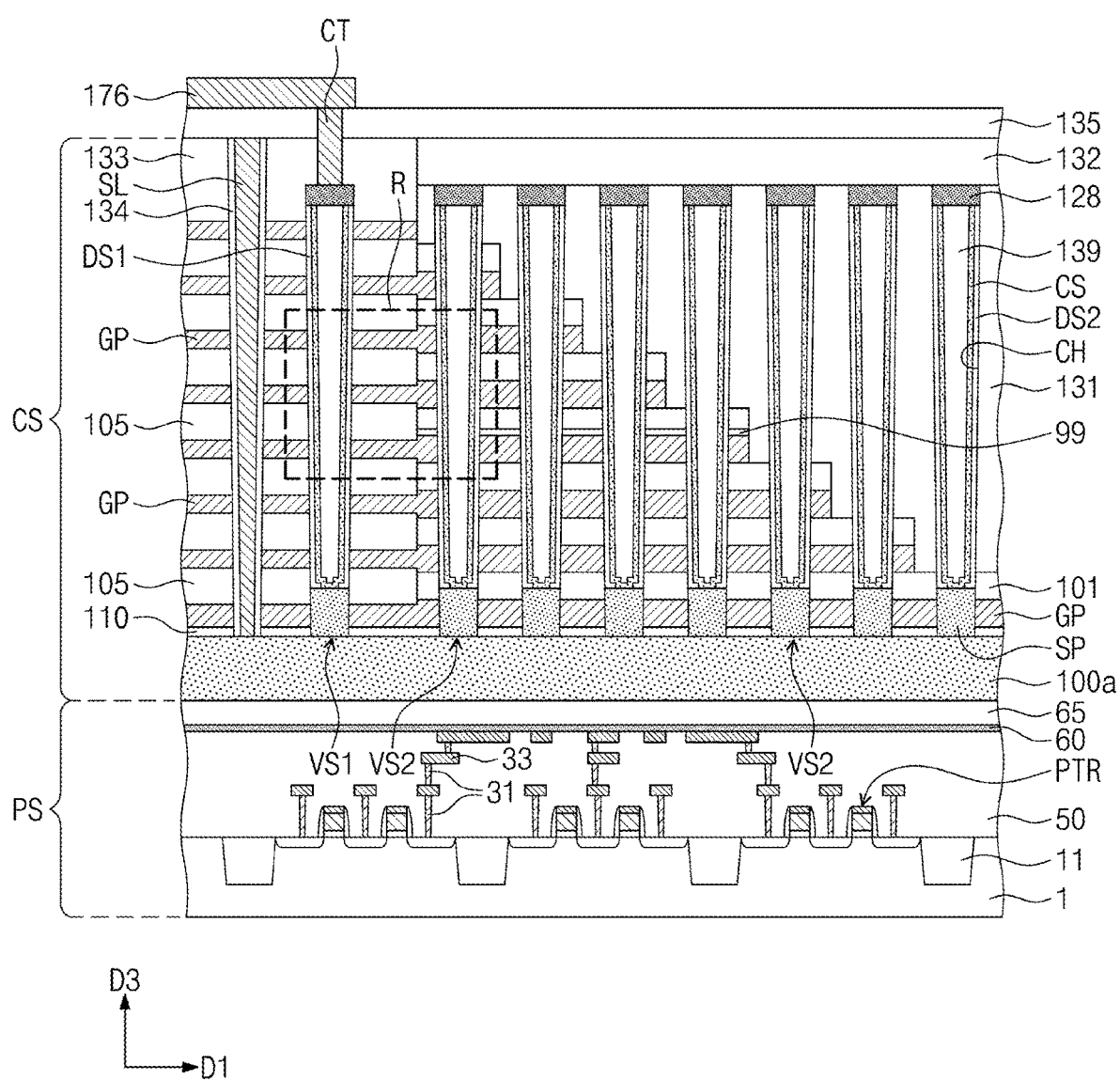
FIG. 23 is a cross-sectional view taken along the line II-II' of FIG. 2 to illustrate a semiconductor memory device according to some embodiments of the inventive concept.

FIG. 23 is a cross-sectional view taken along the line II-IF of FIG. 2 to illustrate a semiconductor memory device according to some embodiments of the inventive concept.

In the embodiments of FIG. 23, a semiconductor memory device may include a peripheral circuit structure PS and a cell array structure CS disposed on the peripheral circuit structure PS. The cell array structure CS may overlap the peripheral circuit structure PS when viewed in a plan view. The peripheral circuit structure PS may include peripheral logic circuits PTR integrated on a semiconductor substrate 1 and a lower interlayer insulating layer 50 on and at least partially covering the peripheral logic circuits PTR.

The semiconductor substrate 1 may include a silicon substrate, a silicon-germanium substrate, a germanium substrate, and/or a single-crystalline epitaxial layer grown on a single-crystalline silicon substrate. The semiconductor substrate 1 may include active regions defined by a device isolation layer 11.

The peripheral logic circuits PTR may include row and column decoders, a page buffer, and control circuits and may include NMOS and PMOS transistors, low-voltage and high-voltage transistors and a resistor, which are integrated on the semiconductor substrate 1. Peripheral circuit interconnection lines 33 may be electrically connected to the peripheral logic circuits PTR through peripheral contact plugs 31. For example, the peripheral contact plugs 31 and the peripheral circuit interconnection lines 33 may be connected to the NMOS and PMOS transistors.

The lower interlayer insulating layer 50 may be on and at least partially cover peripheral gate electrodes, the peripheral contact plugs 31, and the peripheral circuit interconnection lines 33. The lower interlayer insulating layer 50 may include a plurality of stacked insulating layers. For example, the lower interlayer insulating layer 50 may include a silicon oxide layer, a silicon nitride layer, a silicon oxynitride layer, and/or a low-k dielectric layer.

An etch stop layer 60 and a middle interlayer insulating layer 65 may be sequentially stacked on the lower interlayer insulating layer 50. The etch stop layer 60 may be formed of an insulating material having an etch selectivity with respect to the lower interlayer insulating layer 50. For example, the etch stop layer 60 may include a silicon nitride layer and/or a silicon oxynitride layer. For example, the middle interlayer insulating layer 65 may include the same material as the lower interlayer insulating layer 50.

The cell array structure CS may include a stack structure ST on a base layer 100a. The base layer 100a may be formed of a semiconductor material. For example, the base layer 100a may include silicon (Si), germanium (Ge), silicon-germanium (SiGe), gallium-arsenic (GaAs), indium-gallium-arsenic (InGaAs), or aluminum-gallium-arsenic (AlGaAs), or any mixture thereof. For example, the base layer 100a may be formed of a poly-silicon layer doped with N-type dopants.

A region 'R' of FIG. 23 may be similar to FIG. 4 or 19. Except that the stack structure ST includes a third horizontal insulating layer 99, other components of the stack structure ST may be the same or similar as those described in the above embodiments. The third horizontal insulating layer 99 may be provided on the extension region, but may not be provided on the cell array region.

A distance between a pair of the horizontal electrodes GP spaced apart from each other with the third horizontal insulating layer 99 interposed therebetween may be greater than a distance between other horizontal electrodes GP adjacent to each other. The stack structure ST may include a first stack structure and a second stack structure, which are spaced apart from each other with the third horizontal insulating layer 99 interposed therebetween. Each of the vertical structures VS1 and VS2 may have a stepped structure at a level adjacent to the third horizontal insulating layer 99. The stepped structure may be generated because vertical holes in which the vertical structures VS1 and VS2 are provided are formed by a plurality of patterning processes of etching a first mold structure and a second mold structure, respectively.

In the semiconductor memory device according to some embodiments of the inventive concept, the charge storage patterns may be separated from each other in a direction perpendicular to the top surface of the substrate. Thus, charges included in each of the charge storage patterns may not move or spread into other charge storage patterns or the move or spread of the charges may be reduced.

In the method of manufacturing a semiconductor memory device according to some embodiments of the inventive concept, loss or damage of the interlayer insulating layer on the extension region may be reduced or minimized.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor memory device comprising:
a stack structure comprising:
horizontal electrodes sequentially stacked on a substrate including a cell array region and an extension region; and
horizontal insulating layers between the horizontal electrodes; and
vertical structures that penetrate the stack structure, a first one of the vertical structures being on the cell array region and a second one of the vertical structures being on the extension region;
wherein each of the vertical structures comprises:
a channel layer; and
a tunneling insulating layer, a charge storage layer and a blocking insulating layer,
which are sequentially stacked on a sidewall of the channel layer,
wherein the charge storage layer of the first one of the vertical structures includes charge storage patterns spaced apart from each other in a direction perpendicular to a top surface of the substrate with the horizontal insulating layers interposed therebetween,
wherein the charge storage layer of the second one of the vertical structures extends along sidewalls of the horizontal electrodes and sidewalls of the horizontal insulating layers,
wherein the blocking insulating layer of the first vertical structure includes blocking insulating patterns spaced apart from each other in the direction perpendicular to the top surface of the substrate with the horizontal insulating layers interposed therebetween, and
wherein the blocking insulating layer of the second vertical structure extends along the sidewalls of the horizontal electrodes and the sidewalls of the horizontal insulating layers.

2. The semiconductor memory device of claim 1, wherein a width of each of the blocking insulating patterns in the direction perpendicular to the top surface of the substrate is greater than a thickness of a horizontal electrode of the horizontal electrodes adjacent to each of the blocking insulating patterns in the direction perpendicular to the top surface of the substrate.

3. The semiconductor memory device of claim 1, wherein the tunneling insulating layers of the first and second vertical structures extend along the sidewalls of the horizontal electrodes and the sidewalls of the horizontal insulating layers.

4. The semiconductor memory device of claim 1, wherein a width of each of the charge storage patterns in the direction perpendicular to the top surface of the substrate is greater than a thickness of the horizontal electrode adjacent to each of the charge storage patterns in the direction perpendicular to the top surface of the substrate.

5. The semiconductor memory device of claim 1, wherein each of the horizontal electrodes has a first thickness in the direction perpendicular to the top surface of the substrate on the cell array region and has a second thickness in the direction perpendicular to the top surface of the substrate on the extension region, and wherein the second thickness is greater than the first thickness.

6. The semiconductor memory device of claim 1, wherein each of the horizontal electrodes has a stepped structure in which a thickness in the direction perpendicular to the top surface of the substrate is discontinuously changed near a boundary between the cell array region and the extension region.

7. The semiconductor memory device of claim 1, further comprising:
protective semiconductor patterns vertically spaced apart from each other on a sidewall of the blocking insulating layer of the second vertical structure with the horizontal electrodes interposed therebetween.

8. The semiconductor memory device of claim 7, wherein the protective semiconductor patterns include poly-crystalline silicon.

9. The semiconductor memory device of claim 7, wherein the protective semiconductor patterns are confined to the extension region.

10. The semiconductor memory device of claim 1, wherein the stack structure includes stack structures, which extend in a first direction parallel to the top surface of the substrate and are separated from each other in a second direction perpendicular to the first direction,
the semiconductor memory device further comprising:
a separation pattern extending between the stack structures adjacent to each other; and
a protrusion separation pattern protruding from the separation pattern in the second direction.

11. The semiconductor memory device of claim 10, wherein the protrusion separation pattern is on the cell array region.

12. A semiconductor memory device comprising:
a stack structure comprising:
horizontal electrodes sequentially stacked on a substrate including a cell array region and an extension region; and
horizontal insulating layers between the horizontal electrodes; and
vertical structures that penetrate the stack structure,
wherein each of the vertical structures comprises:
a channel layer; and
a tunneling insulating layer, a charge storage layer and a blocking insulating layer, which are sequentially stacked on a sidewall of the channel layer,
wherein each of the horizontal electrodes includes:
a cell portion on the cell array region; and
an extension portion on the extension region,
wherein a top surface of the extension portion is located at a higher level than a top surface of the cell portion relative to a top surface of the substrate being a base reference,
wherein a bottom surface of the extension portion is located at a lower level than a bottom surface of the cell portion relative to the top surface of the substrate being the base reference,
wherein the vertical structures comprise:
a first vertical structure on the cell array region; and
a second vertical structure on the extension region,
wherein the charge storage layer of the first vertical structure includes charge storage patterns spaced apart from each other in a direction perpendicular to the top surface of the substrate with the horizontal insulating layers interposed therebetween, and wherein the charge storage layer of the second vertical structure extends along sidewalls of the horizontal electrodes and sidewalls of the horizontal insulating layers.

13. The semiconductor memory device of claim 12, wherein a thickness of the extension portion in a direction perpendicular to the top surface of the substrate is greater than a thickness of the cell portion in the direction perpendicular to the top surface of the substrate.

14. The semiconductor memory device of claim 12, wherein each of the horizontal electrodes has a stepped structure in which a thickness is discontinuously changed in a direction perpendicular to the top surface of the substrate near a boundary between the cell array region and the extension region.

15. The semiconductor memory device of claim 12, wherein the blocking insulating layer of the first vertical structure includes blocking insulating patterns spaced apart from each other in the direction perpendicular to the top surface of the substrate with the horizontal insulating layers interposed therebetween, and
   wherein the blocking insulating layer of the second vertical structure extends along the sidewalls of the horizontal electrodes and the sidewalls of the horizontal insulating layers.

16. The semiconductor memory device of claim 12, further comprising:
   protective semiconductor patterns vertically spaced apart from each other on a sidewall of the blocking insulating layer of the second vertical structure with the horizontal electrodes interposed therebetween.

17. The semiconductor memory device of claim 16, wherein the protective semiconductor patterns are confined to the extension region.

18. A semiconductor memory device comprising:
   stack structures, each of the stack structures comprising:
      horizontal electrodes extending in a first direction and sequentially stacked on a substrate, which includes a cell array region and an extension region; and
      horizontal insulating layers between the horizontal electrodes, the stack structures being spaced apart from each other in a second direction perpendicular to the first direction;
   separation patterns between the stack structures;
   vertical structures that penetrate the stack structures, the vertical structures comprising a first vertical structure on the cell array region and a second vertical structure on the extension region;
   contacts connected to upper portions of the vertical structures; and
   bit lines on the contacts,
   wherein each of the vertical structures comprises:
      a filling layer;
      a channel layer on a sidewall of the filling layer;
      a tunneling insulating layer, a charge storage layer and a blocking insulating layer, which are sequentially stacked on a sidewall of the channel layer; and
      a pad pattern on a top surface of the channel layer,
   wherein the charge storage layer of the first vertical structure includes charge storage patterns spaced apart from each other in a direction perpendicular to a top surface of the substrate with the horizontal insulating layers interposed therebetween,
   wherein the charge storage layer of the second vertical structure extends along sidewalls of the horizontal electrodes and sidewalls of the horizontal insulating layers,
   wherein the vertical structures comprise:
   a first vertical structure on the cell array region; and
   a second vertical structure on the extension region,
   wherein the charge storage layer of the first vertical structure includes charge storage patterns spaced apart from each other in a direction perpendicular to the top surface of the substrate with the horizontal insulating layers interposed therebetween, and
   wherein the charge storage layer of the second vertical structure extends along sidewalls of the horizontal electrodes and sidewalls of the horizontal insulating layers.

* * * * *